United States Patent
Liu et al.

(10) Patent No.: US 12,191,993 B2
(45) Date of Patent: Jan. 7, 2025

(54) BIT REPLACING FOR LOW DENSITY PARITY CHECK ENCODING

(71) Applicant: QUALCOMM INCORPORATED, San Diego, CA (US)

(72) Inventors: Wei Liu, Beijing (CN); Thomas Joseph Richardson, South Orange, NJ (US); Liangming Wu, Beijing (CN); Changlong Xu, Beijing (CN); Ori Shental, Marlboro, NJ (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 18/261,982

(22) PCT Filed: Mar. 18, 2021

(86) PCT No.: PCT/CN2021/081454
§ 371 (c)(1),
(2) Date: Jul. 18, 2023

(87) PCT Pub. No.: WO2022/193210
PCT Pub. Date: Sep. 22, 2022

(65) Prior Publication Data
US 2024/0097817 A1    Mar. 21, 2024

(51) Int. Cl.
*H04L 1/00* (2006.01)
*H03M 13/00* (2006.01)
*H03M 13/11* (2006.01)

(52) U.S. Cl.
CPC ....... *H04L 1/0041* (2013.01); *H03M 13/1148* (2013.01); *H03M 13/6362* (2013.01);
(Continued)

(58) Field of Classification Search
CPC ... H04L 1/0041; H04L 1/0045; H04L 1/0057; H04L 1/0068; H03M 13/1148;
(Continued)

(56) References Cited

U.S. PATENT DOCUMENTS 10,680,646 B2    6/2020    Richardson
2018/0358984 A1  12/2018   Richardson et al.
(Continued)

FOREIGN PATENT DOCUMENTS

CN    110622425       12/2019
CN    111357218 A     6/2020
(Continued)

OTHER PUBLICATIONS

International Search Report and Written Opinion—PCT/CN2021/081454—ISA/EPO—Dec. 17, 2021.
(Continued)

*Primary Examiner* — Thien Nguyen
(74) *Attorney, Agent, or Firm* — Holland & Hart LLP

(57) ABSTRACT

Methods, systems, and devices for wireless communication are described to support replacing values of one or more information bit vectors with one or more corresponding sets of parity bits. A first wireless device may replace an information bit vector with a parity bit vector, using a set of information bits of the information bit vector and based on a parity check matrix, which may result in generating the set of information bits at an information bit vector corresponding to a parity bit column of the parity check matrix, during encoding. The first wireless device may perform a transmission to a second wireless device, which may receive the transmission, decode the set of information bits to the information bit vector corresponding to the parity bit column. The second wireless device may replace other bit
(Continued)

estimates of a vector corresponding to an information bit column with the set of information bits.

30 Claims, 15 Drawing Sheets

(52) U.S. Cl.
CPC .......... *H04L 1/0045* (2013.01); *H04L 1/0057* (2013.01); *H04L 1/0068* (2013.01)

(58) Field of Classification Search
CPC ........... H03M 13/6362; H03M 13/116; H03M 13/1185; H03M 13/616; H03M 13/6393
See application file for complete search history.

(56) References Cited

U.S. PATENT DOCUMENTS

| | | |
|---|---|---|
| 2019/0036547 A1 | 1/2019 | Kim et al. |
| 2019/0393890 A1 | 12/2019 | Montorsi et al. |
| 2021/0083689 A1* | 3/2021 | Loghin .............. H03M 13/1105 |
| 2024/0056099 A1* | 2/2024 | Yoshida .............. H03M 13/611 |

FOREIGN PATENT DOCUMENTS

| | | |
|---|---|---|
| WO | 2014172874 A1 | 10/2014 |
| WO | WO-2018209035 | 11/2018 |

OTHER PUBLICATIONS

Abbasfar A., et al., "Accumulate Repeat Accumulate Codes", Proc., IEEE Global Telecommunications Conference, GlobecoM '04, Dallas, TX, USA, vol. 1, Nov. 29, 2004-Oct. 11, 2024, pp. 509-513, XP010759740, ISBN: 978-0-7803-8794-2, The Whole Document.

Cohen A.E., et al., "A Low-Complexity Hybrid LDPC Code Encoder for IEEE 802.3an (10GBase-T) Ethernet", IEEE Transactions On Signal Processing, IEEE Service Center, New York, NY, US, vol. 57, No. 10, Oct. 1, 2009, pp. 4085-4094, XP011268804, the whole document.

Nguyen T.T.B., et al., "Efficient QC-LDPC Encoder for 5G New Radio", Electronics, vol. 8, No. 6, Jun. 13, 2019, 15 Pages. p. 668, XP055950547, DOI: 10.3390/electronics8060668, The Whole Document.

Pfister H.D., et al., "Accumulate-Repeat-Accumulate Codes: Capacity-Achieving Ensembles of Systematic Codes for the Erasure Channel With Bounded Complexity", IEEE Transactions on Information Theory, IEEE, USA, vol. 45, No. 6, Jun. 1, 2007, pp. 2088-2115, XP011182547, ISSN: 0018-9448, The Whole Document.

Supplementary European Search Report—EP21930803—Search Authority—Munich—Nov. 5, 2024.

* cited by examiner

BIT REPLACING FOR LOW DENSITY PARITY CHECK ENCODING

CROSS REFERENCE

The present application is a 371 national stage filing of International PCT Application No. PCT/CN2021/081454 by LIU et al. entitled "BIT REPLACING FOR LOW DENSITY PARITY CHECK ENCODING," filed Mar. 18, 2021, which is assigned to the assignee hereof, and which is expressly incorporated by reference in its entirety herein.

FIELD OF TECHNOLOGY

The following relates to wireless communication, including bit replacing for low density parity check (LDPC) encoding.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal FDMA (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

A UE or a base station may encode information for transmission to another wireless device (e.g., a UE or base station). In some cases, the encoding may include puncturing one or more information bit values.

SUMMARY

The described techniques relate to improved methods, systems, devices, and apparatuses that support bit replacing for low density parity check (LDPC) encoding. Generally, the described techniques provide for performing a preprocessing technique at a first wireless device, before encoding information bit vectors, to replace the values of one or more information bit vectors with one or more corresponding sets of parity bits. For example, a preprocessing component of the first wireless device may replace a first set of information bits of a first information bit vector with a first set of parity bits (e.g., a first parity bit vector), which may be determined based on the first set of information bits (e.g., and one or more other information bit vectors). Similarly, the preprocessing component of the first wireless device may replace a second set of information bits of a second information bit vector with a second set of parity bits (e.g., a second parity bit vector), which may be determined based on the second set of information bits of the second information bit vector (e.g., and one or more other information bit vectors).

Replacing the first and second information bit vectors with the respective parity bit values may result in generating (e.g., by an encoder) values of the first set of information bits at a first information bit vector corresponding to a parity bit column of a parity check matrix, and generating (e.g., by the encoder) the second set of information bits at a second information bit vector corresponding to a second parity bit column of the parity check matrix. The first wireless device may perform a transmission to a second wireless device, which may receive the transmission and decode the values of the first and second sets of information bits to the respective information bit vectors corresponding to the parity bit columns (e.g., of the parity check matrix). The second wireless device may also decode the values of the first and second sets of parity bits to the respective parity bit vectors corresponding to information bit columns (e.g., of the parity check matrix). The second wireless device may perform a postprocessing technique, after decoding, to replace the one or more sets of parity bits of the parity bit vector(s) with one or more corresponding sets of information bits received via the corresponding information bit vector(s).

A method for wireless communication is described. The method may include generating a first set of multiple vectors each including a respective set of information bits having a first quantity, where each vector of the first plurality is associated with a respective index indicating an order of the first set of multiple vectors with respect to a lifted parity check matrix, replacing a first set of information bits of a first vector of the first set of multiple vectors with a first set of parity bits having the first quantity, where the first set of parity bits is based on the first set of information bits, encoding the first set of multiple vectors according to the lifted parity check matrix and the replacing, and performing, at a first wireless device, a transmission to a second wireless device based on the encoding.

An apparatus for wireless communication is described. The apparatus may include a processor, memory coupled with the processor, and instructions stored in the memory. The instructions may be executable by the processor to cause the apparatus to generate a first set of multiple vectors each including a respective set of information bits having a first quantity, where each vector of the first plurality is associated with a respective index indicating an order of the first set of multiple vectors with respect to a lifted parity check matrix, replace a first set of information bits of a first vector of the first set of multiple vectors with a first set of parity bits having the first quantity, where the first set of parity bits is based on the first set of information bits, encode the first set of multiple vectors according to the lifted parity check matrix and the replacing, and perform, at a first wireless device, a transmission to a second wireless device based on the encoding.

Another apparatus for wireless communication is described. The apparatus may include means for generating a first set of multiple vectors each including a respective set of information bits having a first quantity, where each vector of the first plurality is associated with a respective index indicating an order of the first set of multiple vectors with respect to a lifted parity check matrix, means for replacing a first set of information bits of a first vector of the first set of multiple vectors with a first set of parity bits having the first quantity, where the first set of parity bits is based on the first set of information bits, means for encoding the first set of multiple vectors according to the lifted parity check matrix and the replacing, and means for performing, at a first wireless device, a transmission to a second wireless device based on the encoding.

A non-transitory computer-readable medium storing code for wireless communication is described. The code may include instructions executable by a processor to generate a first set of multiple vectors each including a respective set of information bits having a first quantity, where each vector of the first plurality is associated with a respective index indicating an order of the first set of multiple vectors with respect to a lifted parity check matrix, replace a first set of information bits of a first vector of the first set of multiple vectors with a first set of parity bits having the first quantity, where the first set of parity bits is based on the first set of information bits, encode the first set of multiple vectors according to the lifted parity check matrix and the replacing, and perform, at a first wireless device, a transmission to a second wireless device based on the encoding.

Some examples of the method, apparatuses, and non-transitory computer-readable medium described herein may further include operations, features, means, or instructions for replacing a second set of information bits of a second vector of the first set of multiple vectors with a second set of parity bits having the first quantity, where the second set of parity bits may be based on the second set of information bits.

Some examples of the method, apparatuses, and non-transitory computer-readable medium described herein may further include operations, features, means, or instructions for determining the second set of parity bits based on the second set of information bits and the first set of parity bits, where replacing the second set of information bits may be based on determining the second set of parity bits.

Some examples of the method, apparatuses, and non-transitory computer-readable medium described herein may further include operations, features, means, or instructions for determining the second set of parity bits based on the second set of information bits, the first set of parity bits, and a group of one or more third sets of information bits each corresponding to a respective vector of the first set of multiple vectors, where replacing the second set of information bits may be based on determining the second set of parity bits.

In some examples of the method, apparatuses, and non-transitory computer-readable medium described herein, encoding the first set of multiple vectors may include operations, features, means, or instructions for generating a second set of multiple vectors each including a respective set of bits having the first quantity, the second set of multiple vectors including a third vector that includes the second set of information bits based on replacing the second set of information bits of the second vector.

In some examples of the method, apparatuses, and non-transitory computer-readable medium described herein, the transmission includes the second set of information bits based on generating the second set of multiple vectors.

Some examples of the method, apparatuses, and non-transitory computer-readable medium described herein may further include operations, features, means, or instructions for puncturing the second vector after generating the second set of multiple vectors.

Some examples of the method, apparatuses, and non-transitory computer-readable medium described herein may further include operations, features, means, or instructions for determining the first set of parity bits based on the first set of information bits and a group of one or more second sets of information bits each corresponding to a respective vector of the first set of multiple vectors, where replacing the first set of information bits may be based on determining the first set of parity bits.

In some examples of the method, apparatuses, and non-transitory computer-readable medium described herein, encoding the first set of multiple vectors may include operations, features, means, or instructions for generating a second set of multiple vectors each including a respective set of bits having the first quantity, the second set of multiple vectors including a fourth vector that includes the first set of information bits based on replacing the first set of information bits of the first vector.

Some examples of the method, apparatuses, and non-transitory computer-readable medium described herein may further include operations, features, means, or instructions for puncturing the first vector after generating the second set of multiple vectors.

In some examples of the method, apparatuses, and non-transitory computer-readable medium described herein, encoding the first set of multiple vectors may include operations, features, means, or instructions for performing an LDPC encoding process on the first set of multiple vectors.

In some examples of the method, apparatuses, and non-transitory computer-readable medium described herein, the transmission includes the first set of information bits based on the encoding.

In some examples of the method, apparatuses, and non-transitory computer-readable medium described herein, generating the first set of multiple vectors may include operations, features, means, or instructions for performing an amplitude shaping process on the first set of multiple vectors.

In some examples of the method, apparatuses, and non-transitory computer-readable medium described herein, the lifted parity check matrix may include operations, features, means, or instructions for a set of first columns, each first column associated with a respective index corresponding to a vector of the first set of multiple vectors, a set of second columns, each second column associated with a respective index corresponding to a vector of a second set of multiple vectors each including a respective set of parity bits having the first quantity, and a set of rows, each row corresponding to a parity check equation for generating a respective vector of the second set of multiple vectors.

A method for wireless communication is described. The method may include receiving a transmission from a first wireless device at a second wireless device, decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix, replacing a first set of bits of a first vector of the first set of multiple vectors with a first set of information bits of a fourth vector of the second set of multiple vectors, where the first set of information bits is associated with the first vector, and identifying a set of multiple information bits of the transmission based on the replacing.

An apparatus for wireless communication is described. The apparatus may include a processor, memory coupled with the processor, and instructions stored in the memory. The instructions may be executable by the processor to cause the apparatus to receive a transmission from a first wireless device at a second wireless device, decode the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix, replace a first set of bits of a first vector of the first set of multiple vectors with a first set of information bits of a fourth vector of the second set of multiple vectors, where the first set of information bits is associated with the first vector, and identify a set of multiple information bits of the transmission based on the replacing.

Another apparatus for wireless communication is described. The apparatus may include means for receiving a transmission from a first wireless device at a second wireless device, means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix, means for replacing a first set of bits of a first vector of the first set of multiple vectors with a first set of information bits of a fourth vector of the second set of multiple vectors, where the first set of information bits is associated with the first vector, and means for identifying a set of multiple information bits of the transmission based on the replacing.

A non-transitory computer-readable medium storing code for wireless communication is described. The code may include instructions executable by a processor to receive a transmission from a first wireless device at a second wireless device, decode the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix, replace a first set of bits of a first vector of the first set of multiple vectors with a first set of information bits of a fourth vector of the second set of multiple vectors, where the first set of information bits is associated with the first vector, and identify a set of multiple information bits of the transmission based on the replacing.

In some examples of the method, apparatuses, and non-transitory computer-readable medium described herein, decoding the transmission may include operations, features, means, or instructions for decoding the first set of information bits to the fourth vector and setting a log-likelihood ratio (LLR) of the first vector to a value of zero, where the first set of bits of the first vector may be determined based on setting the LLR of the first vector to a value of zero.

In some examples of the method, apparatuses, and non-transitory computer-readable medium described herein, the fourth vector may be associated with a first parity bit column of the lifted parity check matrix.

In some examples of the method, apparatuses, and non-transitory computer-readable medium described herein, decoding the transmission may include operations, features, means, or instructions for decoding a second set of information bits to a third vector of the second set of multiple vectors.

In some examples of the method, apparatuses, and non-transitory computer-readable medium described herein, the third vector may be associated with a second parity bit column of the lifted parity check matrix.

Some examples of the method, apparatuses, and non-transitory computer-readable medium described herein may further include operations, features, means, or instructions for replacing a second set of bits of a second vector of the first set of multiple vectors with the second set of information bits.

In some examples of the method, apparatuses, and non-transitory computer-readable medium described herein, decoding the transmission may include operations, features, means, or instructions for setting an LLR of the second vector to a value of zero, where the second set of bits of the second vector may be determined based on setting the LLR of the second vector to a value of zero.

In some examples of the method, apparatuses, and non-transitory computer-readable medium described herein, decoding the transmission may include operations, features, means, or instructions for performing an LDPC decoding process on the transmission.

In some examples of the method, apparatuses, and non-transitory computer-readable medium described herein, the lifted parity check matrix may include operations, features, means, or instructions for a set of first columns, each first column associated with a respective index corresponding to a vector of the first set of multiple vectors, a set of second columns, each second column associated with a respective index corresponding to a vector of the second set of multiple vectors, and a set of rows, each row corresponding to a parity check equation for generating a respective vector of the second set of multiple vectors.

DETAILED DESCRIPTION

Some wireless devices (e.g., base stations and/or user equipments (UEs)) may perform an amplitude shaping process, for example, to generate information bits for communication between wireless devices. The amplitude shaping process may provide an increased communication quality, for example, by providing a shaping gain and rate adaptation functionality. In some examples, an encoder of the wireless device may encode information bit vectors (e.g., for transmission) using a low density parity check (LDPC) encoding process. The encoder may, for example, generate parity bit vectors (e.g., encode the information bit vectors) for performing error checking on the information bit vectors. The encoder may use a base graph and associated lifted parity check matrix to generate the parity bit vectors. Before transmitting, the wireless device may puncture one or more information bit vectors, which may, in some cases, reduce or eliminate some of the gains provided by the amplitude shaping process.

The present disclosure provides techniques to increase (e.g., recover) gains provided by the amplitude shaping process. For example, a first wireless device (e.g., a UE or base station) may perform a preprocessing technique, before encoding, to replace one or more sets of information bits (e.g., one or more corresponding information bit vectors) with one or more corresponding sets of parity bits (e.g., one or more corresponding parity bit vectors), which may result in generating the set(s) of information bits at one or more corresponding information bit vectors corresponding to one or more parity bit columns of the parity check matrix (e.g., during encoding). The techniques described herein may thereby avoid puncturing the one or more sets of information bits (e.g., by generating the set(s) of information bits at one or more non-punctured vectors associated with a parity bit column). A second wireless device (e.g., a receiving device, such as a UE or a base station) may decode the values of the one or more sets of information bits to the respective information bit vectors corresponding to parity bit columns (e.g., of the parity check matrix) and decode the values of the one or more sets of parity bits to the respective parity bit vectors corresponding to information bit columns (e.g., of the parity check matrix). The second device may perform a postprocessing technique, after decoding the transmission, to replace the one or more sets of parity bits of the parity bit vector(s) with one or more corresponding sets of information bits received via the corresponding information bit vector(s).

Aspects of the disclosure are initially described in the context of wireless communications systems. Aspects of the disclosure are further illustrated by and described with reference to diagrams, base graphs, a process flow, apparatus diagrams, system diagrams, and flowcharts that relate to bit replacing for LDPC encoding.

Figure 1:
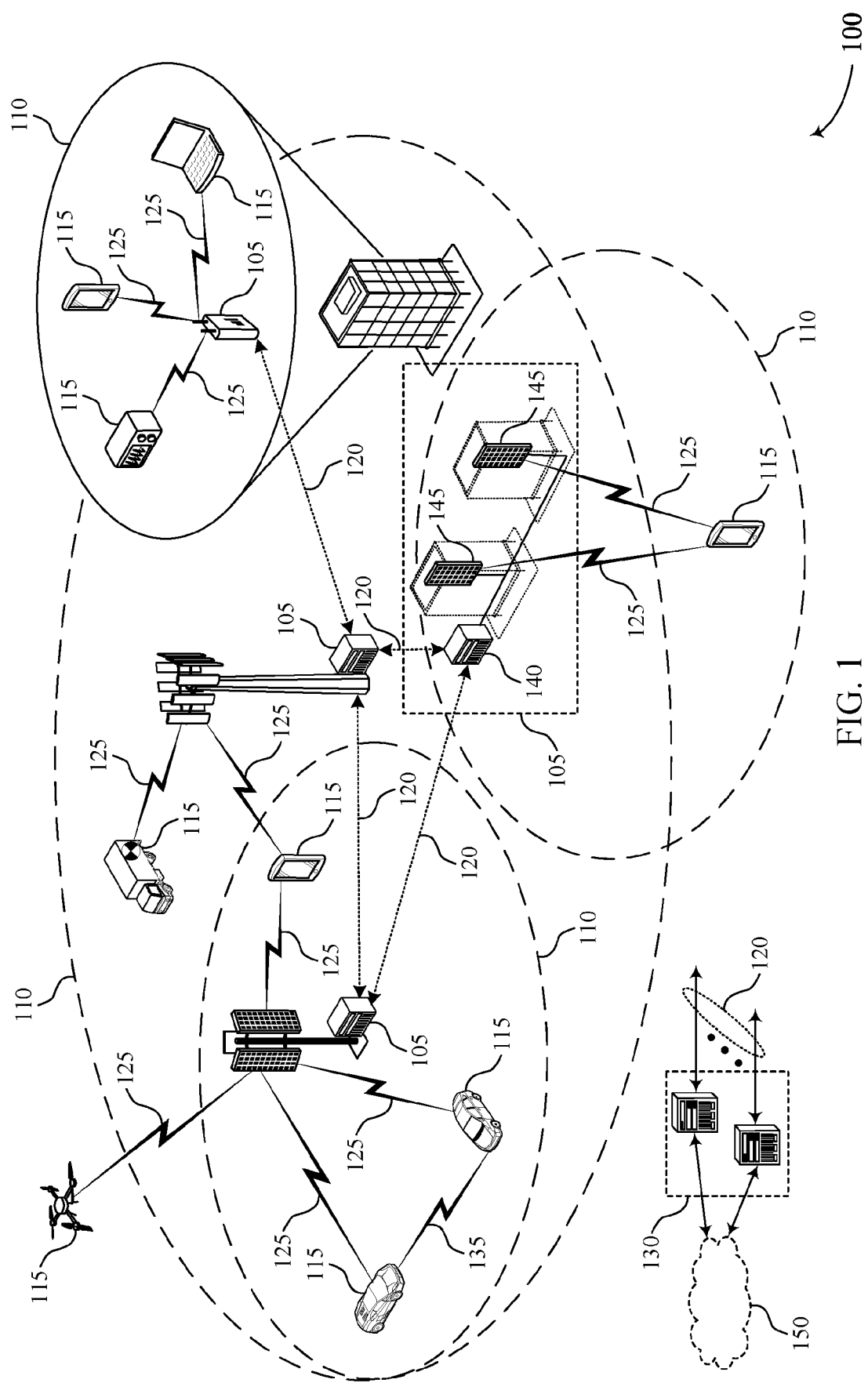
FIG. 1 illustrates an example of a wireless communications system that supports bit replacing for low density parity check (LDPC) encoding in accordance with aspects of the present disclosure.

FIG. 1 illustrates an example of a wireless communications system 100 that supports bit replacing for LDPC encoding in accordance with aspects of the present disclosure. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

The time intervals for the base stations 105 or the UEs 115 may be expressed in multiples of a basic time unit which may, for example, refer to a sampling period of T, $=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to IP services 150 for one or more network operators. The IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (HF) or very high frequency (VHF) portion of the spectrum below 300 MHz.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A wireless device, such as a UE 115 or a base station 105, may perform encoding and/or decoding of a wireless transmission using a base graph (e.g., base parity check matrix) and associated lifted parity check matrix. For example, the wireless device (e.g., a transmitting wireless device) may select a base graph (e.g., a first base graph or second base graph) and a lifting factor (e.g., Z). The selection may be based on a code block segmentation procedure, such as a procedure specified by a wireless communications standard. The base graph may include a first set of columns, each corresponding to a respective set of information bits (e.g., a set or vector including Z information bits). For example, a first base graph may include 22 information bit columns corresponding to column indices 1-22, and a second base graph (e.g., a different base graph) may include 10 information bit columns corresponding to column indices 1-10. A base graph may also include a set of rows each representative of a parity check equation for generating a respective parity bit. The base graph may further include a second set of columns, each corresponding to a respective set of parity bits (e.g., a set or vector including Z parity bits).

For example, the first base graph may include up to 46 parity bit columns, which may correspond to column indices 23-26 (e.g., which may be columns associated with core parity bits) and columns 27-68 (e.g., which may be columns associated with extension parity bits). The second base graph may include 42 parity bit columns corresponding to column indices 11-14 (e.g., which may be columns associated with core parity bits) and columns 15-52 (e.g., which may be columns associated with extension parity bits). Extension parity bits may represent parity bits that may or may not be used for encoding, such that usage of the extension parity bits may be optional and may be used to adjust a coding rate for the encoder.

As described herein, information bit columns (e.g., corresponding to information bit column indices) may be referred to as information bit columns, regardless of the values of a vector corresponding to an information bit column. For example, an information bit column (e.g., corresponding to column index 1) may correspond to an information bit vector or to a parity bit vector, and the column may still be referred to as an information bit column (e.g., based on the column index as described herein). Similarly, parity bit columns (e.g., corresponding to parity bit column indices) may be referred to as parity bit columns, regardless of the values of a vector corresponding to a parity bit column. For example, a parity bit column (e.g., corresponding to column index 29) may correspond to an information bit vector or a parity bit vector, and the column may still be referred to as parity bit column (e.g., based on the column index as described herein).

The wireless device may use the selected base graph (e.g., the first or second base graph) and lifting factor Z to construct a corresponding lifted parity check matrix. The dimensions of the lifted parity check matrix may be based on the dimensions (e.g., rows and columns) of the associated base graph (e.g., may be multiplied by the lifting factor Z). For example, the lifted parity check matrix may have a size of 46Z×68Z (e.g., rows by columns) if the first base graph is selected, or may have a size of 42Z×52Z if the second base graph is selected.

The wireless device may use a base parity check matrix and the lifting factor Z to construct a lifted parity check matrix. Each entry in the lifted parity check matrix may be based on a corresponding entry of the base graph that the lifted parity check matrix is based on, where an entry of the base graph or the lifted parity check matrix may be located at a corresponding intersection of a row index and a column index. The lifting factor Z may specify an integer in a domain (e.g., a domain of integers $\{0, 1, \ldots, Z-1\} \cup \{-1\}$) for each entry of the base graph, for construction of the portions of the lifted parity check matrix associated with the entry of the base graph.

Each entry of the base graph corresponding to an integer value of −1 (e.g., corresponding to a blank entry or non-entry of the base graph) may be replaced with a Z×Z matrix of all zeros for the construction of the lifted parity check matrix. Other entries of the base graph may be replaced with a Z×Z permutation matrix (e.g., $P_{i,j}$, where i and j respectively indicate the row and column of the entry of the base graph). The permutation matrix may be based on the associated integer (e.g., specified according to the associated integer), such as by starting non-zero values at a column associated with the integer. Each entry of the base graph (e.g., each ith and jth entry) may be replaced by a corresponding permutation matrix $P_{i,j}$ for construction of the lifted parity check matrix.

A first lifted parity check matrix (e.g., corresponding to the first base graph) may include 22Z information bit columns corresponding to column indices 1-22Z, and a second lifted parity check matrix (e.g., corresponding to the second base graph) may include 10Z information bit columns corresponding to column indices 1-10Z. A lifted parity check matrix may also include a set of rows each representative of a parity check equation for generating a respective parity bit. The lifted parity check matrix may further include a second set of columns, each corresponding to a parity bit of a set of parity bits. For example, the first lifted parity check matrix may include up to 46Z parity bit columns, which may correspond to column indices 22Z+1 to 26Z (e.g., which may be columns associated with core parity bits) and columns 26Z+1 to 68Z (e.g., which may be columns associated with extension parity bits). The second lifted parity check matrix may include 42Z parity bit columns corresponding to column indices 10Z+1 to 14Z (e.g., which may be columns associated with core parity bits) and columns 14Z+1 to 52Z (e.g., which may be columns associated with extension parity bits).

A wireless device may use a selected base graph, a selected lifting factor (e.g., Z), and a corresponding lifted parity check matrix to encode a transmission by determining a set of parity check bits for an information bit sequence to be transmitted. After performing the encoding process, a first 2Z information bits of the information bit sequence may be punctured (e.g., corresponding to a first two column indices of the base graph or a first 2Z column indices of the lifted parity check matrix). These 2Z information bits may correspond, for example, to information bit column indices $\{1, 2, \ldots, Z\} \cup \{Z+1, \ldots, 2Z\}$ of the lifted parity check matrix.

A first wireless device (e.g., a UE 115 or a base station 105) may perform a preprocessing technique, before encoding, to replace one or more sets of information bits with one or more sets of parity bits, which may result in generating the one or more sets of information bits at one or more respective information bit vectors corresponding to parity bit columns of a parity check matrix, and thereby avoid puncturing the one or more information bits during encoding. Similarly, a second wireless device (e.g., a receiving device, such as a UE 115 or a base station 105) may perform a postprocessing technique, after decoding, to replace the values of the vectors associated with the one or more sets of parity bits with the one or more sets of information bits.

Figure 2:
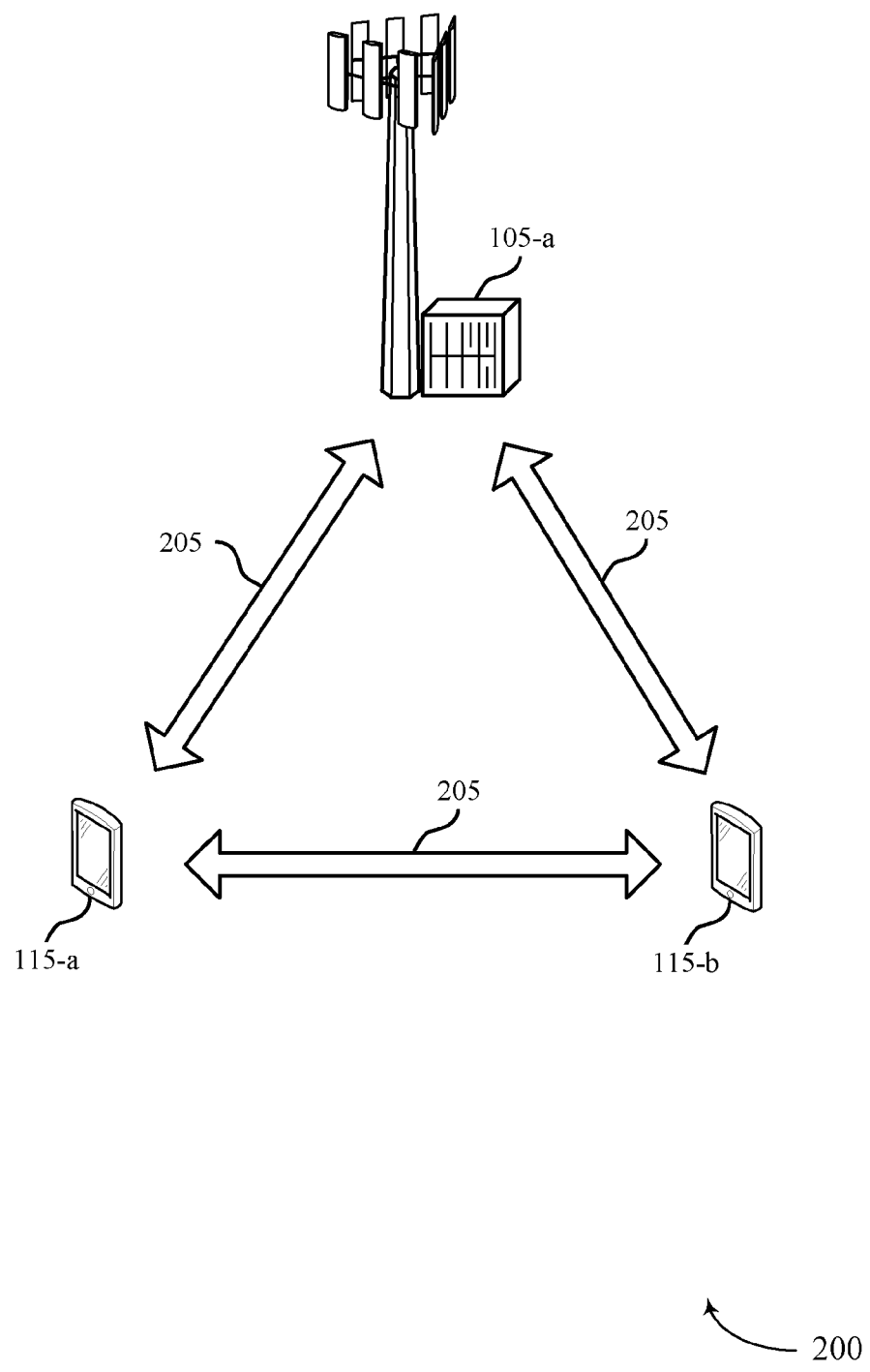
FIG. 2 illustrates an example of a wireless communications system that supports bit replacing for LDPC encoding in accordance with aspects of the present disclosure.

FIG. 2 illustrates an example of a wireless communications system 200 that supports bit replacing for LDPC encoding in accordance with aspects of the present disclosure. In some examples, the wireless communications system 200 may implement aspects of the wireless communications system 100. For example, wireless communications system 200 may include UE 115-a, UE 115-b, and base station 105-a, which may be examples of UEs 115 and a base station 105 as described with reference to FIG. 1. It should be noted that UE 115-a, UE 115-b, and base station 105-a represent examples of wireless devices, and that aspects of the present disclosure may apply to wireless communications between any two wireless devices. For example, aspects of the present disclosure may apply to communications between a base station 105 and a UE 115 (e.g., in the uplink or the downlink) or between two UEs 115, among other examples of communications between wireless devices.

A transmitting wireless device (e.g., UE 115-a, UE 115-b, or base station 105-a), may process (e.g., encode) information bits (e.g., data or control information) before transmitting the information bits via a respective wireless communication channel 205. A receiving wireless device (e.g., UE 115-a, UE 115-b, or base station 105-a) may process (e.g., decode) the information bits after receiving the information bits via the respective channel 205. For example, UE 115-a, UE 115-b, base station 105-a, or any combination thereof, may include a preprocessing component, an encoder, or both, for processing the information bits before transmission. Similarly, UE 115-a, UE 115-b, base station 105-a, or any combination thereof, may include a decoder, a postprocessing component, or both, that processes the received information bits.

Some wireless devices may include a probabilistic amplitude shaping (PAS) architecture for an amplitude shaping process, for example, to encode or decode information bits for communication between wireless devices. PAS may represent one application of a process for generating information bits, among other bit generation processes. It should be noted that aspects of the present disclosure may apply in the context of other bit generation processes, and that PAS is merely an example of such a process. In some examples, a PAS architecture of a transmitting wireless device (e.g., a UE 115 or a base station 105) may process information bits using an amplitude shaper component, an amplitude-to-bit conversion component, an encoder (e.g., a systematic forward error correction (FEC) encoder), and a mapping component (e.g., a quadrature amplitude modulation (QAM) mapping component) before transmission over a channel 205.

For example, a sequence of bits having a uniform distribution (e.g., a distribution based on the bit values) may be processed by the amplitude shaper component, which may shape the sequence of bits into one or more symbol sequences that have a target distribution. The amplitude-to-bit conversion component may convert the one or more symbol sequences into a sequence of bits that retains the target distribution. The encoder may encode the sequence of bits that includes the target distribution. The mapping component may process the bits (e.g., may modulate the bits in the target distribution for transmission), and a transmitting wireless device (e.g., a UE 115 or a base station 105) may transmit a signal based on the modulated bits, for example, over the channel 205 to a receiving wireless device (e.g., a UE 115 or a base station 105).

In some examples, a PAS architecture of a receiving wireless device may process information bits (e.g., after reception of the signal over the channel) using a demapper component (e.g., a bitwise log-likelihood ratio (LLR) demapper), a decoder (e.g., a systematic FEC decoder component), a bit-to-amplitude conversion component, and an amplitude deshaper component. For example, the demapper component may demodulate (e.g., demap) the signal to generate LLR values for estimated bits in a sequence of bits. The decoder may decode the sequence of bits (e.g., using the LLR values) and the bit-to-amplitude conversion component may convert the decoded sequence of bits into one or more symbol sequences. The amplitude deshaper component may deshape the one or more symbol sequences into a sequence of bits, which may be used by the receiving device. In some cases, wireless devices that use the PAS architecture may benefit from an increased communication quality by providing low-complexity integration of amplitude shaping into existing binary FEC systems, which may provide a shaping gain and a rate adaptation functionality.

In some examples, an encoder in a PAS architecture may encode information bits using an NR LDPC encoding process, among other examples of encoding processes. The encoder may, for example, generate parity bits (e.g., encode the information bits) for performing error checking on the information bits (e.g., for performing error checking at a receiving wireless device). The encoder may use a base graph (e.g., a base parity check matrix) and a lifted parity check matrix to generate the parity bits, as described herein (e.g., with respect to FIG. 1). Examples of base graphs and associated lifted parity check matrices are further described herein with reference to FIGS. 4A and 4B.

The parity check equations (e.g., rows) of the base graph and corresponding lifted parity check matrix may be based on a structure of the base graph or lifted parity check matrix and may include values corresponding to one or more of the information bits. In some cases, the parity check equation may additionally include values corresponding to one or more already-generated parity bits. In one example, the encoder may use a first equation based on the lifted parity check matrix to generate a first vector of parity bits (e.g., a parity bit vector including Z parity bits and corresponding to a column index 23 in the first base graph, a parity bit vector corresponding to a column index 11 in the second base graph). The first equation may use or include a first group of information bit vectors associated with the first equation.

The encoder may use the lifted parity check matrix to generate (e.g., sequentially generate), or encode, additional parity bit vectors (e.g., parity bit vectors corresponding to column indices 24, 25, and 26 in the first base graph, parity bit vectors corresponding to column indices 12, 13, and 14 in the second base graph). The additional parity bit vectors (e.g., each including Z parity bits) may each be generated using a corresponding equation from a row of the lifted parity check matrix, and may be generated based on a respective group of information bit vectors (e.g., indicated by the row) and one or more already-generated parity bit vectors (e.g., parity bit vector number 23 in the first base graph, parity bit vector number 11 in the second base graph), as indicated by the row of the lifted parity check matrix.

After the encoding process, the encoder may puncture one or more information bit vectors (e.g., each including Z information bits). For example, a transmitter may puncture an information bit vector corresponding to column index 1 (e.g., corresponding to the base parity check matrix), an information bit vector corresponding to column index 2 (e.g., corresponding to the base parity check matrix), or both. As described herein, puncturing the one or more information bit vectors may include setting a value of the one or more information bit vectors such that a decoder of a receiving device may set an LLR to a value of zero for the one or more punctured information bit vectors. Puncturing the one or more information bit vectors may, in some cases, reduce or eliminate some of the gains provided by the amplitude shaping process (e.g., PAS), for example, because the PAS process may result in gains that are based on shaping the information bit vectors (e.g., including the punctured vectors).

The present disclosure provides techniques to recover some of the gains provided by the amplitude shaping process. For example, a first wireless device (e.g., UE 115-a, UE 115-b, base station 105-a) may perform a preprocessing technique, before encoding, to replace one or more information bit vectors (e.g., each including a set of Z information bits) with one or more corresponding parity bit vectors (e.g., each including a set of Z parity bits), and thereby avoid puncturing one or more sets of information bits (e.g., information bits associated with the one or more information bit vectors). In some examples, a preprocessing component (e.g., a low-complexity preprocessing component) of the first wireless device may perform the preprocessing technique, and an encoder (e.g., an NR LDPC encoder) of the first wireless device may perform the encoding (e.g., after the preprocessing, such that a hardware or other aspect of the encoder may be unchanged). Based on the encoding, the original information bit values of the one or more information bit vectors may be encoded at one or more information bit vectors corresponding to one or more parity bit columns of a parity check matrix, as described with reference to FIG. 4A or 4B). As described herein with reference to FIG. 1, information bit columns or parity bit columns may respectively be referred to as information bit columns or parity bit columns, regardless of the values of a vector corresponding to a column.

A second wireless device (e.g., a receiving device, such as UE 115-a, UE 115-b, or base station 105-a) may perform a postprocessing technique, after decoding, to replace the parity bit vectors corresponding to the information bit columns with the information bit vectors corresponding to parity bit columns. In some examples, a decoder (e.g., an NR LDPC decoder) of the second wireless device may perform the decoding (e.g., before the postprocessing, such that a hardware aspect or other aspect of the decoder may be unchanged), and a postprocessing component (e.g., a low-complexity postprocessing component) of the second wireless device may perform the preprocessing technique after the decoding.

The preprocessing component of the first wireless device may change a first information bit column of the base graph (e.g., column index 1 of the base graph, originally associated with a first information bit) and a second information bit column of the base graph (e.g., column index 2 of the base graph, originally associated with a second information bit) to correspond to parity bit vectors (e.g., associated with parity bits). The preprocessing component may similarly change two corresponding parity bit columns (e.g., originally associated with parity bits) of the base graph to correspond to information bit vectors (e.g., associated with information bits).

For example, the parity bit column indices (e.g., $c_1$ and $c_2$) may be selected (e.g., by the first wireless device, by the preprocessing component of the first wireless device) from column indices of the first base graph corresponding to any two indices from column index 27 to column index 68 (e.g., selected from column indices $\{27, 28, \ldots, 68\}$). Additionally or alternatively, the parity bit column indices (e.g., $c_1$ and $c_2$) may be selected from column indices of the second base graph corresponding to any two indices from column index 15 to column index 52 (e.g., selected from column indices $\{15, 16, \ldots, 52\}$).

Setting a correspondence (e.g., changing the correspondence) between parity bit vectors, information bit vectors, and their corresponding columns of the parity check matrix may be performed using the lifted parity check matrix (e.g., formed using a base parity check matrix and a lifting factor Z). For example, a first Z column indices (e.g., column indices $\{1, 2, \ldots, Z\}$) of the lifted parity check matrix (e.g., corresponding to a first set of information bits that includes the Z information bits in the first information bit vector) may be changed to correspond to parity bits (e.g., parity bit vectors). Similarly, parity bit column indices (e.g., column indices $\{(c_1-1)Z+1, \ldots, c_1Z\}$, corresponding to the first set of parity bits of the first parity bit vector) may be changed to correspond to information bits (e.g., information bit vectors). Additionally, a second Z column indices (e.g., column indices $\{Z+1, \ldots, 2Z\}$) of the lifted parity check matrix (e.g., corresponding to a second set of information bits that includes the Z information bits in the second information bit vector) may be changed to correspond to parity bits (e.g., parity bit vectors). Parity bit column indices (e.g., column indices $\{(c_2-1)Z+1, \ldots, c_2Z\}$) may also be changed to correspond to information bits (e.g., information bit vectors).

For example, the preprocessing component may generate a first parity bit vector (e.g., including Z parity bits) based on values of information bits (e.g., Z information bits) of the first information bit vector, and based on corresponding values of a first set of information bit vectors indicated by the lifted parity check matrix (e.g., corresponding to information bit vectors indicated by Z rows or equations of the lifted parity check matrix, which rows indices may be given by $\{(r-1)Z+1, \ldots, rZ\}$ for an integer r). The preprocessing component may replace the first information bit vector with the first parity bit vector. Similarly, the preprocessing component may generate a second parity bit vector (e.g., including Z parity bits) based on values of information bits (e.g., Z information bits) of the second information bit vector, as well as based on the value of the first parity bit vector and corresponding values of a second set of information bit vectors of the lifted parity check matrix (e.g., corresponding to information bit vectors indicated by another Z rows or equations of the lifted parity check matrix). The preprocessing component may replace the second information bit vector with the second parity bit vector.

Setting the first and second Z columns of the lifted parity check matrix to correspond to parity bit vectors may result in generating (e.g., by the encoder, such as by using a corresponding set of parity equations) the values of original information bits of the first information bit vector at a first information bit vector corresponding to a first set of parity bit columns (e.g., first parity location) of the lifted parity check matrix and generating (e.g., by the encoder) the values of the original information bits of the second information bit vector at a second information bit vector corresponding to a second set of parity bit columns (e.g., second parity location) of the lifted parity check matrix. The positions or locations of the generated first set of information bits and second set of information bits may correspond to the parity bit vectors that are changed to or replaced with information bit vectors. The encoder may perform the encoding and the transmitter may puncture the parity bits associated with the first and second Z columns.

The first wireless device may perform a transmission to the second wireless device (e.g., over a channel 205), which may receive the transmission and decode the values of the first and second information bit vectors (e.g., estimates of the information bit values) to the respective information bit vectors associated with the corresponding parity bit columns of the lifted parity check matrix. The second wireless device may perform a postprocessing technique (e.g., at a postprocessing component), after decoding (e.g., by the decoder), to replace the decoded values of the first and second parity bit vectors (e.g., that correspond to information bit columns) with decoded information bit vectors that correspond to parity bit columns (e.g., the first and second information bit vectors, respectively).

Figure 3:
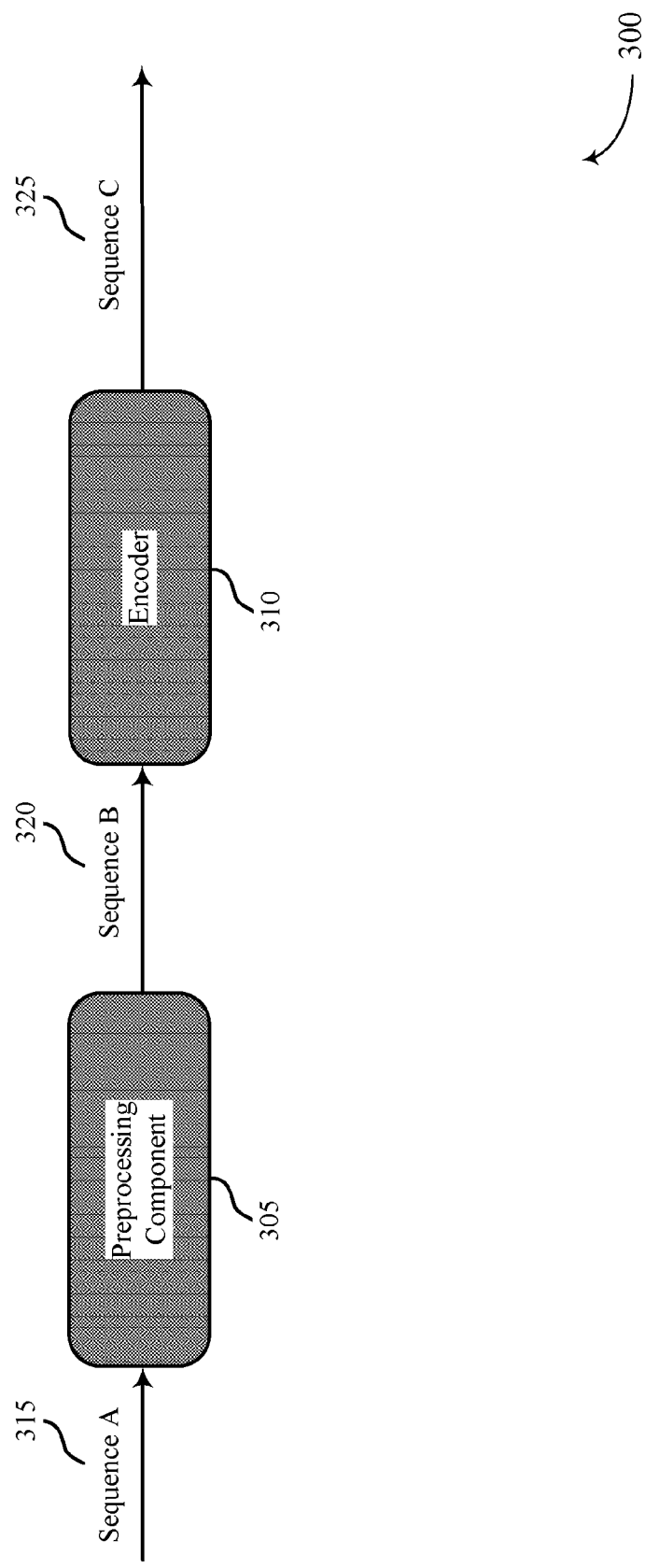
FIG. 3 illustrates an example of a block diagram that supports bit replacing for LDPC encoding in accordance with aspects of the present disclosure.

FIG. 3 illustrates an example of a block diagram 300 that supports bit replacing for LDPC encoding in accordance with aspects of the present disclosure. In some examples, block diagram 300 may illustrate one or more components of a wireless device (e.g., a transmitting or first wireless device), such as a UE 115 or a base station 105 as described with reference to FIGS. 1 and 2. For example, block diagram 300 may illustrate a preprocessing component 305 and an encoder 310. Block diagram 300 may also illustrate the flow of information, or bits, between such components. For example, the preprocessing component 305 and encoder 310 may respectively preprocess information bits and encode information bits, for example, as represented by sequences of bits.

In some cases, the preprocessing component 305 (e.g., and the techniques performed thereby) may represent a part of an encoding formula or process (e.g., may represent a preprocessing portion of an encoding formula or process of the encoder 310). In some other cases, the preprocessing component 305 (e.g., and the techniques performed thereby) may be different or separate from an encoding formula or process (e.g., may represent a separate preprocessing technique performed before using an encoding formula or process of the encoder 310).

In some examples, the preprocessing component 305 may preprocess a sequence 315 or sequence A (e.g., according to one or more techniques described with reference to FIG. 2), where sequence 315 may be a sequence of bits (e.g., information bit vectors). In a first example (e.g., associated with a first base graph and corresponding first lifted parity check matrix), sequence 315 may be represented by a sequence of bit vectors $[b_1, b_2, b_3, \ldots, b_{22}]$, where each $b_i$ may represent a vector of Z bits. For example, each vector $b_i$ (e.g., where i=1, 2, . . . , 22) may be represented by a set of information bits $[b_{i,0}, b_{i,1}, \ldots, b_{i,Z-1}]$. Sequence 315 may thus represent a sequence of 22 information bit vectors corresponding to values of column indices 1-22 of the first base graph, or corresponding to value of column indices 1-22Z of the first lifted parity check matrix (e.g., a total of 22Z information bits as represented by the base graph or lifted parity check matrix).

In a second example (e.g., associated with a second base graph and corresponding second lifted parity check matrix), sequence 315 may be represented by a sequence of bit vectors $[b_1, b_2, b_3, \ldots, b_{10}]$, where each $b_i$ may represent a vector of Z bits. For example, each vector $b_i$ (e.g., where i=1, 2, . . . , 10) may be represented by a set of information bits $[b_{i,0}, b_{i,1}, \ldots, b_{i,Z-1}]$. Sequence 315 may thus represent a sequence of 10 information bit vectors corresponding to values of column indices 1-10 of the second base graph, or corresponding to value of column indices 1-10Z of the second lifted parity check matrix (e.g., a total of 10Z information bits as represented by the base graph or lifted parity check matrix).

The preprocessing component 305 may generate one or more sets of parity bits (e.g., may generate 2Z parity bits, according to one or more techniques as described with reference to FIG. 2). For example, the preprocessing component 305 may generate a first parity bit vector $\alpha$ (e.g., a first set of parity bits) and a second parity bit vector $\beta$ (e.g., a second set of parity bits). Additional techniques for generating the one or more parity bits are further described with reference to FIG. 4. The preprocessing component 305 may replace each of one or more information bit vectors associated with information bit columns (e.g., column indices 1 and 2 of the base graph) with a corresponding parity bit vector.

For example, preprocessing component 305 may replace information bit vectors $b_1$ and $b_2$ with parity bit vectors $\alpha$ and $\beta$, respectively. For example, the preprocessing component 305 may replace the first 2Z information bits (e.g., associated with vectors $b_1$ and $b_2$) with 2Z parity bits represented by vectors $\alpha$ and $\beta$. Preprocessing component 305 may output a sequence 320 (e.g., sequence B) based on replacing the information bits with the one or more parity bit vectors (e.g., or values thereof). For example, sequence 320 may be represented by $[\alpha, \beta, b_3, \ldots, b_{22}]$ when preprocessing component 305 outputs a sequence of 22 vectors (e.g., respectively replacing values of information bit vectors $b_1$ and $b_2$ with values of parity bit vectors $\alpha$ and $\beta$). Additionally or alternatively, sequence 320 may be represented by $[\alpha, \beta, b_3, \ldots, b_{10}]$ when preprocessing component 305 outputs a sequence of 10 vectors (e.g., respectively replacing values of information bit vectors $b_1$ and $b_2$ with values of parity bit vectors $\alpha$ and $\beta$).

The encoder 310, which may be an example of an NR LDPC encoder, may encode sequence 320 (e.g., according to one or more techniques described with reference to FIG. 2). The encoder 310 may output a sequence 325 (e.g., Sequence C), for example, which may be represented by $[\alpha, \beta, b_3, \ldots, b_{22}, b_{23}, b_{26}, b_2, b_{28}, b_1, \ldots]$ when the encoder 310 encodes a sequence of 22 information bit vectors, where vectors $b_{23}$ through $b_{26}$ and $b_{28}$ may be examples of parity bit vectors generated by the encoder 310. In such cases, the original information bit values of $b_1$ and $b_2$ (e.g., before replacing) may be respectively generated (e.g., by the encoder 310) at information bit vectors corresponding to parity bit column indices 29 and 27, respectively (e.g., based on values $\alpha$ and $\beta$), where the encoder may generate parity bit values for vector indices at or above column index 23 of the base graph or column indices $\{22Z+1, \ldots, 23Z\}$ of the lifted parity check matrix.

Additionally or alternatively, sequence 325 may be represented by $[\alpha, \beta, b_3, \ldots, b_{10}, b_{11}, \ldots, b_{14}, \ldots, b_2, \ldots, b_1, \ldots]$ when the encoder 310 encodes a sequence of 10 information bit vectors, where vectors 11-14 may be examples of parity bit vectors generated by the encoder 310. In such cases, the original information bit values of $b_1$ and $b_2$ (e.g., before replacing) may be generated (e.g., by the encoder 310) at information bit vectors corresponding to parity bit column indices 29 and 21, respectively (e.g., based on values $\alpha$ and $\beta$), where the encoder may generate parity bit values for vector indices at or above column index 11 of the base graph or column indices $\{10Z+1, \ldots, 11Z\}$ of the lifted parity check matrix.

The encoder 310 may thus generate information bit vectors $b_1$ and $b_2$ corresponding to parity bit columns according to one or more techniques described herein. For example, the encoder 310 may perform encoding (e.g., standard NR LDPC encoding) using output 320, which may generate parity bits based on the output 320, and which may generate the original information bit values of $b_1$ and $b_2$ corresponding to parity bit columns. While the examples herein describe some vectors used for storing the information bit values of $b_1$ and $b_2$, it is to be understood that the same techniques may apply for generating the information bit values of $b_1$ and $b_2$ at any vector corresponding to parity bit columns (e.g., based on parity bit rows or equations selected for generating a and as described with reference to FIG. 4). As described with reference to FIG. 2, output 325 (e.g., the output of the encoder 310) may be used to perform mapping and transmit a signal via a channel (e.g., to a receiving device).

Figure 4A:
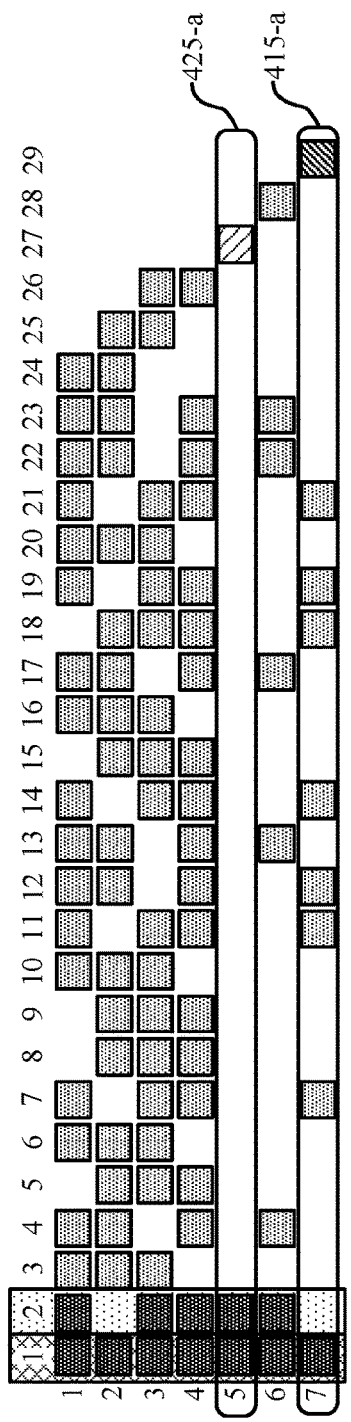
FIGS. 4A and 4B illustrate examples of base graphs that support bit replacing for LDPC encoding in accordance with aspects of the present disclosure.
Figure 4B:
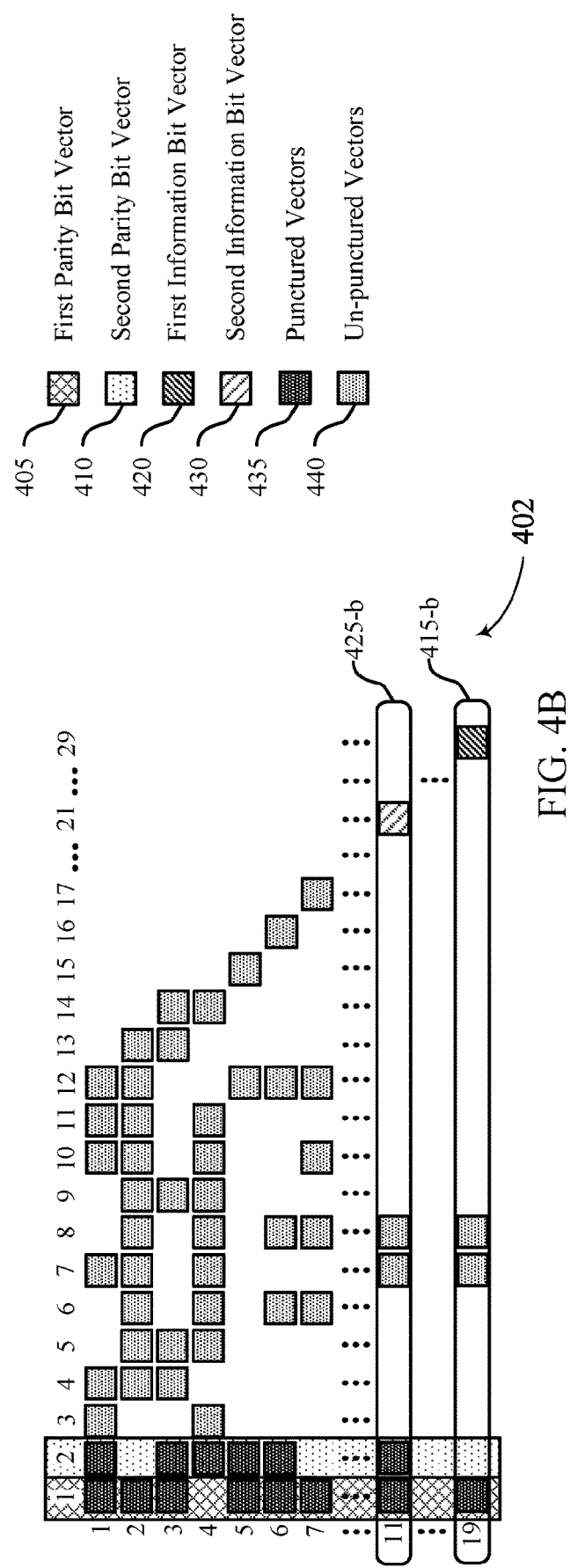

FIGS. 4A and 4B illustrate example of parity check matrices 401 and 402 that support bit replacing for LDPC encoding in accordance with aspects of the present disclosure. In some examples, a first and second wireless device, such as two UEs 115 or a UE 115 and a base station 105 as described with references to FIGS. 1-3, may implement or store aspects of parity check matrix 401 or parity check matrix 402. In some examples, some techniques of the present disclosure may be performed using a parity check matrix, such as parity check matrix 401, parity check matrix 402, or the like. For example, parity check matrices 401 and 402 may represent respective examples of a parity check matrix (e.g., a lifted parity check matrix or a base parity check matrix), as described with reference to FIGS. 2 and 3. For example, parity check matrices 401 and 402 may represent respective examples of a first base graph and a second base graph, respectively. It is to be understood that the same techniques described herein with reference to parity check matrices 401 and 402 may apply to any parity check matrix without departing from the scope of the present disclosure.

Each column index of a parity check matrix (e.g., parity check matrix 401 or 402) may be associated with a respective vector of bits (e.g., an information bit vector or a parity bit vector). For example, a first set of columns may represent information bit columns (e.g., column indices 1-22 with respect to parity check matrix 401, column indices 1-10 with respect to parity check matrix 402), and a second set of columns may represent parity bit columns (e.g., column indices 23-29 with respect to parity check matrix 401, column indices 11-29 with respect to parity check matrix 402). Some parity bit columns may correspond to core parity bit vectors (e.g., column indices 23-26 with respect to parity check matrix 401, column indices 11-14 with respect to parity check matrix 402), while some parity bit columns may correspond to extension parity bit vectors (e.g., columns 27-68 with respect to parity check matrix 401 (columns 30-68 not shown), and columns 15-52 with respect to parity check matrix 402 (columns 18-20, 22-28, and 30-52 not shown). As described herein with reference to FIG. 1, information bit columns or parity bit columns may respectively be referred to as information bit columns or parity bit columns, regardless of the values of a vector corresponding to a column.

For example, a column index 1 (e.g., corresponding to a first vector) may be associated with a first information bit vector, a column index 2 (e.g., corresponding to a second vector) may be associated with a second information bit vector, and so on for information bit columns. Similarly, each parity column index (e.g., corresponding to a parity bit vector) may be associated with a respective vector of parity bits. Each row of a base parity check matrix may be associated with a set of parity check equations for generating a respective parity bit vector, as described at least with reference to FIG. 2. For example, information bit vectors and/or parity bit vectors indicated in a row of the parity check matrix may form part of an equation for determining a parity bit vector (e.g., last parity bit vector) indicated by the row.

As such, a number of columns of a parity check matrix may be related to or based on a number of rows of the parity check matrix. For example, a parity check matrix with seven parity bit columns (e.g., base graph 401, having parity bit column indices 23-29) may also have seven rows. While the examples illustrated in FIGS. 4A and 4B show seven and nineteen rows (e.g., and corresponding quantities of parity bit vectors), respectively, it is to be understood that the examples described with reference to FIGS. 4A and 4B may apply to any number of rows (e.g., and corresponding quantities of parity bit vectors), for example, based on a configuration of a corresponding parity check matrix.

As described herein, a preprocessing component may configure one or more information bit column indices of parity check matrix 401 or 402 to correspond to parity bit vectors and may configure one or more parity bit column indices to correspond to information bit vectors, as described with reference to FIGS. 2 and 3. As further described with reference to FIGS. 2 and 3, the preprocessing component may preprocess a first sequence of information bit vectors, and may output a second sequence including information bit vectors and one or more parity bit vectors (e.g., replacing the first and second information bit vectors), based on the first sequence of bits. In some examples, the preprocessing component may be overlaid on an encoder, such as an NR LDPC encoder.

Each information bit vector of the first sequence may correspond to a respective column of a base graph (e.g., columns 1-22 of parity check matrix 401, columns 1-10 of parity check matrix 402). As described with reference to FIGS. 2 and 3, the preprocessing component may generate values for a first parity bit vector 405 (e.g., a parity bit vector $\alpha$) and values for a second parity bit vector 410 (e.g., a parity bit vector ($\beta$), corresponding to an information bit column originally corresponding to a first information bit vector 420 and an information bit column originally corresponding to a second information bit vector 430, respectively. A value of the first parity bit vector 405 may be based on a value of the first information bit vector 420 and values of a set of information bit vectors associated with an equation 415 (e.g., a row) of the parity check matrix. A value of the second parity bit vector 410 may be based on a value of the second information bit vector 430, the value of the first parity bit vector 405, and values of a set of information bits associated with an equation 425 (e.g., a row) of the parity check matrix.

The row indices of the base parity check matrix for determining the parity bit vectors may be selected from a base parity check matrix as described herein (e.g., selected by a first wireless device, or a preprocessing component thereof). For example, if a base parity check matrix corresponds to the first base graph described herein, the first wireless device may select two row indices (e.g., $r_1$ and $r_2$) from a row corresponding to an extension parity bit (e.g., from row indices $\{5, 6, \ldots, 46\}$), such that an entry $(r_1, i)$ and an entry $(r_2, i)$ of the base parity check matrix are equal to $-1$ for all i in $\{23, 24, 25, 26\}$. One entry (e.g., exactly one entry) of a sub-matrix formed by row indices $r_1$ and $r_2$ and column indices $c_1$ and $c_2$ may be equal to $-1$ (e.g., where $c_1$ and $c_2$ may represent the column indices $c_1$ and $c_2$ as described herein), where the entry set to $-1$ may be replaced by an all-zero Z×Z matrix when the based parity check matrix is lifted to a lifted parity check matrix. In one example, a sub-matrix formed by entries (5, 1), (5, 2), (7, 1) and (7, 2) may include an entry (7, 2) that is equal to $-1$. Based on determining $r_1$ and $r_2$, the first wireless device may set $c_1$ to be equal to $r_1+22$, and may set $c_2$ to be equal to $r_2+22$ (e.g., based on the 22 information bit columns for the base parity check matrix), such that if $r_1$ is 7 and $r_2$ is 5, $c_1$ may be equal to 29 and $c_2$ may be equal to 27.

Similarly, if a base parity check matrix corresponds to the second base graph described herein, the first wireless device may select two row indices (e.g., $r_1$ and $r_2$) from a row corresponding to an extension parity bit (e.g., from row indices {5, 6, . . . , 42}), such that an entry $(r_1, i)$ and an entry $(r_2, i)$ of the base parity check matrix are equal to −1 for all i in {11, 12, 13, 14}. One entry (e.g., exactly one entry) of a sub-matrix formed by row indices $r_1$ and $r_2$ and column indices $c_1$ and $c_2$ may be equal to −1 (e.g., where $c_1$ and $c_2$ may represent the column indices $c_1$ and $c_2$ as described herein), where the entry set to −1 may be replaced by an all-zero Z×Z matrix when the based parity check matrix is lifted to a lifted parity check matrix. Based on determining $r_1$ and $r_2$, the first wireless device may set $c_1$ to be equal to $r_1$+10, and may set $c_2$ to be equal to $r_2$+10 (e.g., based on the 10 information bit columns for the base parity check matrix), such that if $r_1$ is 19 and $r_2$ is 11, $c_1$ may be equal to 29 and $c_2$ may be equal to 21.

In a first example, according to parity check matrix 401 (e.g., a first base parity check matrix) and a lifting factor Z, the preprocessing component may solve for the first parity bit vector 405 using a parity check equation 415-a associated with a first row of the parity check matrix 401 (e.g., row index 7) that omits the core parity bit vectors. Similarly, the preprocessing component may solve for the second parity bit vector 410 using a parity check equation 425-a associated with a second row of the parity check matrix 401 that includes the first parity bit vector 405 and omits the core parity bit vectors (e.g., row number 5).

The preprocessing component may solve for the first parity bit vector 405 using the values of the first information bit vector 420, along with any information bit vectors indicated by the first row (e.g., information bit vectors 7, 11, 12, 14, 18, 19, and 21). For example, the preprocessing component may permute each vector involved in the equation according to the corresponding permutation matrix (e.g., $P_{i,j}$), using the information bit values of the first information bit vector 420 at a location or index corresponding to the first parity bit vector (e.g., column 29). The value of the first parity bit vector 405 as permuted by the corresponding permutation matrix may be equal to a modulo-2 sum of the other vectors in the row (e.g., including the first information bit vector 420), each permuted according to the corresponding permutation matrix.

The preprocessing component may further solve for the second parity bit vector 410 using the values of the second information bit vector 430, the first parity bit vector 405, and any information bit vectors indicated by the second row. For example, the preprocessing component may permute each vector involved in the equation according to the corresponding permutation matrix (e.g., PO, using the information bit values of the second information bit vector 430 at a location or index corresponding to the second parity bit vector (e.g., column 27). The value of the second parity bit vector 410 as permuted by the corresponding permutation matrix may be equal to the modulo-2 sum of the other vectors in the row (e.g., including the second information bit vector 430 and the first parity bit vector 405), each permuted according to the corresponding permutation matrix.

In one example, according to the variables described herein, $r_1$ may be equal to 7, $c_1$ may be equal to 29 (e.g., corresponding to the parity bit vector associated with row 7), $r_2$ may be equal to 5, and $c_2$ may be equal to 27 (e.g., corresponding to the parity bit vector associated with row 5). Thus, the preprocessing component may use row 7 of the base parity check matrix (e.g., row indices {6Z+1, . . . , 7Z} of the lifted parity check matrix) to generate the first parity bit vector 405. Based on the first parity bit vector 405 being associated with a set of information bit columns of the lifted parity check matrix, the encoder may generate values of the first information bit vector 420 corresponding to parity bit column index 29. The preprocessing component may also use row 5 of the base parity check matrix (e.g., row indices {4Z+1, . . . , 5Z} of the lifted parity check matrix) to generate the second parity bit vector 410, which may result in generating the values of the second information bit vector 430 corresponding to parity bit column index 27 (e.g., by the encoder).

The preprocessing component may generate the values of the first parity bit vector 405 using information bit vectors $b_1$ (e.g., the first information bit vector 420 values, corresponding to column 29), $b_7$, $b_{11}$, $b_{14}$, $b_{18}$, $b_{19}$, and $b_{21}$. The value of the first parity bit vector 405 (e.g., a) may be determined by equation (1):

$$P_{7,1}\alpha = P_{7,7}b_7 + P_{7,11}b_{11} + P_{7,12}b_{12} + P_{7,14}b_{14} + P_{7,18}b_{18} + P_{7,19}b_{19} + P_{7,21}b_{21} + P_{7,29}b_1 \quad (1)$$

where α represents the first parity bit vector 405, $b_i$ represents an ith information bit vector (e.g., corresponding to the ith column of the base parity check matrix, where i may be equal to 1, 7, 11, 12, 14, 18, 19, 21, or 29), and $P_{7,i}$ represents a permutation matrix corresponding to the seventh row of the base parity check matrix (e.g., the equation of the seventh row) and an ith column (e.g., where i may be equal to 1, 7, 11, 12, 14, 18, 19, 21, or 29).

The preprocessing component may further generate the values of the second parity bit vector 410 using information bit vector $b_2$ (e.g., the second information bit vector 430 values, corresponding to column 27) and parity bit vector α. The value of the second parity bit vector 410 (e.g., β) may be determined by equation (2):

$$P_{5,2}\beta = P_{5,1}\alpha + P_{5,27}b_2 \quad (2)$$

where β represents the second parity bit vector 410, $b_i$ represents an ith information bit vector (e.g., corresponding to the ith column of the base parity check matrix, where i may be equal to 2), and $P_{5,i}$ represents a permutation matrix corresponding to the fifth row of the base parity check matrix (e.g., the equation of the fifth row) and an ith column (e.g., where i may be equal to 1, 2, or 27).

In a second example, according to parity check matrix 402 (e.g., a second parity check matrix), the preprocessing component may solve for the first parity bit vector 405 using a parity check equation 415-b associated with a first row of the parity check matrix 402 (e.g., row index 19) that omits the core parity bit vectors. Similarly, the preprocessing component may solve for the second parity bit vector 410 using a parity check equation 425-b associated with a second row of the parity check matrix 401 that includes the first parity bit vector 405 and omits the core parity bit vectors (e.g., row number 11).

The preprocessing component may solve for the first parity bit vector 405 using the values of the first information bit vector 420, along with any information bit vectors indicated by the first row (e.g., information bit vectors 7 and 8). For example, the preprocessing component may permute each vector involved in the equation according to the corresponding permutation matrix (e.g., PO, using the information bit values of the first information bit vector 420 at a location or index corresponding to the first parity bit vector (e.g., column 29). The value of the first parity bit vector 405 as permuted by the corresponding permutation matrix may be equal to the modulo-2 sum of the other vectors in the row (e.g., including the first information bit vector 420), each permuted according to the corresponding permutation matrix.

The preprocessing component may further solve for the second parity bit vector 410 using the values of the second information bit vector 430, the first parity bit vector 405, and any information bit vectors indicated by the second row (e.g., information bit vectors 7 and 8). For example, the preprocessing component may permute each vector involved in the equation according to the corresponding permutation matrix (e.g., PO, using the information bit values of the second information bit vector 430 at a location or index corresponding to the second parity bit vector (e.g., column 21). The value of the second parity bit vector 410 as permuted by the corresponding permutation matrix may be equal to the modulo-2 sum of the other vectors in the row (e.g., including the second information bit vector 430 and the first parity bit vector 405), each permuted according to the corresponding permutation matrix.

In one example, according to the variables described herein, $r_1$ may be equal to 19, $c_1$ may be equal to 29 (e.g., corresponding to the parity bit vector associated with row 19), $r_2$ may be equal to 11, and $c_2$ may be equal to 21 (e.g., corresponding to the parity bit vector associated with row 11). Thus, the preprocessing component may use row 19 of the base parity check matrix (e.g., row indices $\{18Z+1, \ldots, 19Z\}$ of the lifted parity check matrix) to generate the first parity bit vector 405. Based on the first parity bit vector 405 being associated with a set of information bit columns of the lifted parity check matrix, the encoder may generate values of the first information bit vector 420 corresponding to parity bit column index 29. The preprocessing component may also use row 11 of the base parity check matrix (e.g., row indices $\{10Z+1, \ldots, 11Z\}$ of the lifted parity check matrix) to generate the second parity bit vector 410, which may result in generating the values of the second information bit vector 430 corresponding to parity bit column index 21 (e.g., by the encoder).

The preprocessing component may generate the values of the first parity bit vector 405 using information bit vectors $b_1$ (e.g., the first information bit vector 420 values, corresponding to column 29), $b_7$, and $b_8$. The value of the first parity bit vector 405 (e.g., $\alpha$) may be determined by equation (3):

$$P_{19,1}\alpha = P_{19,7}b_7 + P_{19,8}b_8 + P_{19,29}b_1 \quad (3)$$

where $\alpha$ represents the first parity bit vector 405, $b_i$ represents an ith information bit vector (e.g., corresponding to the ith column of the base parity check matrix, where i may be equal to 1, 7, or 8), and $P_{19,i}$ represents a permutation matrix corresponding to the nineteenth row of the base parity check matrix (e.g., the equation of the nineteenth row) and an ith column (e.g., where i may be equal to 1, 7, 8, or 29).

The preprocessing component may further generate the values of the second parity bit vector 410 using information bit vectors $b_2$ (e.g., the second information bit vector 430 values, corresponding to column 21), $b_7$, and $b_8$, as well as parity bit vector $\alpha$. The value of the second parity bit vector 410 (e.g., $\beta$) may be determined by equation (4):

$$P_{11,2}\beta = P_{11,1}\alpha + P_{11,7}b_7 + P_{11,8}b_8 + P_{11,21}b_2 \quad (4)$$

where $\beta$ represents the second parity bit vector 410, $b_i$ represents an ith information bit vector (e.g., corresponding to the ith column of the base parity check matrix, where i may be equal to 2, 7, or 8), and $P_{11,i}$ represents a permutation matrix corresponding to the eleventh row of the base parity check matrix (e.g., the equation of the eleventh row) and an ith column (e.g., where i may be equal to 1, 2, 7, 8, or 21).

The preprocessing component may output a second sequence of bits to an encoder, and the encoder may encode the sequence of bits for transmission. For example, the encoder may perform the encoding and a transmitter may puncture the first parity bit vector 405 and the second parity bit vector 410 (e.g., associated with the first and second columns of the base parity check matrix), such that the first and second parity bit vectors 405 and 410 may represent punctured bits 435 and other vectors may represent unpunctured bits 440. The encoder may generate or re-generate the first information bit vector 420 and the second information bit vector 430 corresponding to the respective parity bit columns (e.g., corresponding to column indices 29 and 27 with respect to parity check matrix 401, and column indices 29 and 21 with respect to base parity check matrix 402). The encoder may output a third sequence of bits, which may include bits that are to be punctured (e.g., punctured bits 435).

The wireless device that includes the preprocessing component and the encoder may transmit a signal including information based on the third sequence of bits, for example, excluding the punctured parity bits (e.g., punctured bits 435) and including the first information bit vector 420 and the second information bit vector 430 (e.g., associated with their respective parity bit locations or columns). In this way, the wireless device may transmit some or all of the information bits, without puncturing the information bits. Thus, wireless systems may recover some or all of the gains provided by an amplitude shaping process performed on the information bits.

While some aspects of the present disclosure (e.g., in FIG. 4 or elsewhere) may describe examples of replacing information bit vectors with two corresponding parity bit vectors corresponding to information bit columns, and vice versa, such examples are given merely by way of example. For example, the present disclosure may further support techniques for swapping any number of parity bit vectors and corresponding information bit vectors, according to the examples described herein.

Figure 5:
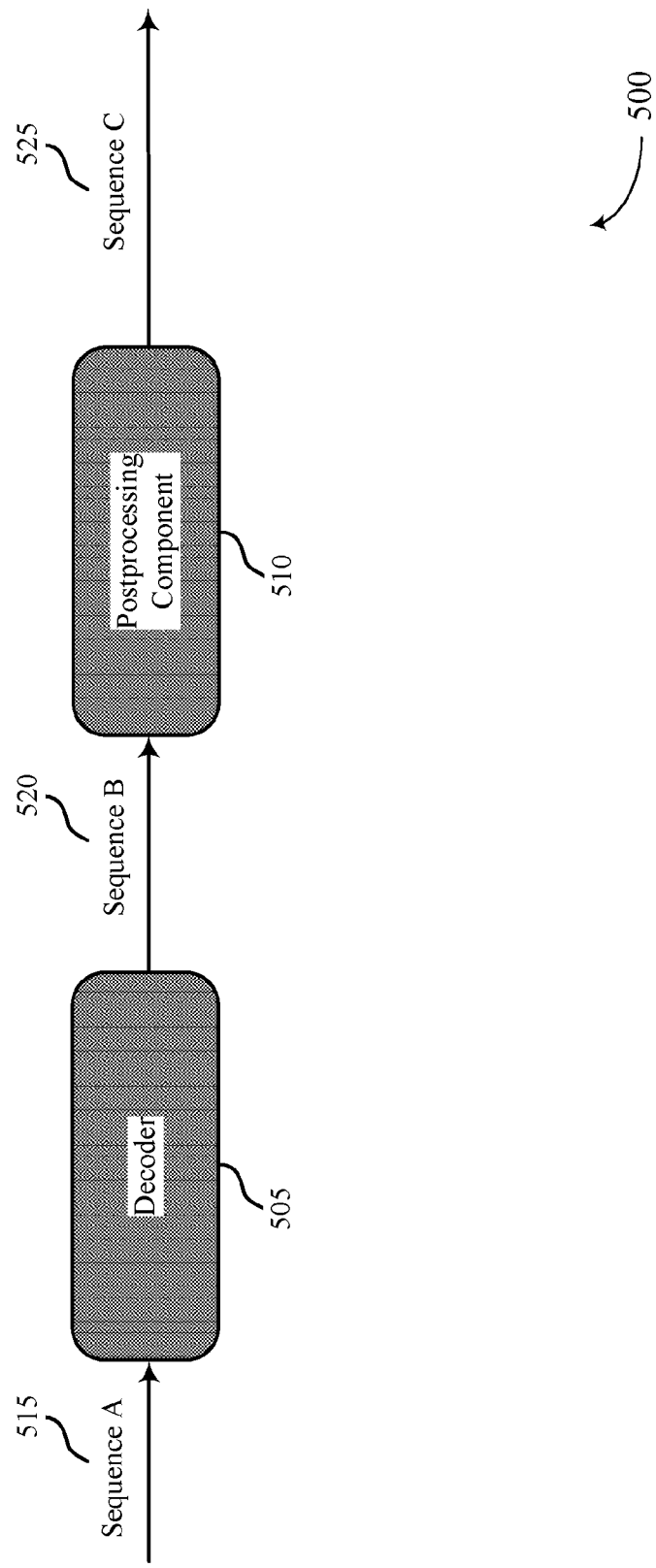
FIG. 5 illustrates an example of a block diagram that supports bit replacing for LDPC encoding in accordance with aspects of the present disclosure.

FIG. 5 illustrates an example of a block diagram 500 that supports bit replacing for LDPC encoding in accordance with aspects of the present disclosure. In some examples, block diagram 500 may illustrate components of a wireless device, such as a UE 115 or a base station 105 as described with reference to FIGS. 1-4. For example, block diagram 500 may illustrate a decoder 505 and a postprocessing component 510. Block diagram 500 may also illustrate the flow of information, or bits, between such components. For example, the decoder 505 and postprocessing component 510 may respectively decode received information bits and process the decoded information bits, for example, as represented by sequences of bits.

In some cases, the postprocessing component 510 (e.g., and the techniques performed thereby) may represent a part of a decoding formula or process (e.g., may represent a postprocessing portion of a decoding formula or process of the decoder 505). In some other cases, the postprocessing component 510 (e.g., and the techniques performed thereby) may be different or separate from a decoding formula or process (e.g., may represent a separate postprocessing technique after performing a decoding formula or process of the decoder 505).

The wireless device (e.g., a second or receiving wireless device) may receive a signal or transmission from another wireless device (e.g., a first wireless device, such as a UE 115 or a base station 105). The decoder 505 may decode the received transmission, which may include or represent a sequence of bits on which the decoder 505 may perform the decoding. For example, the decoder 505 may receive a sequence 515 (e.g., sequence A) from a transceiver or other component of the wireless device and may performing decoding (e.g., NR LDPC decoding) on the sequence 515. The sequence 515 may be represented, for example, for a first lifted parity check matrix by vector values $[y_3, \ldots y_{22}, y_{23}, \ldots, y_{26}, y_2, y_{28}, \ldots]$, where vectors having an index greater than or equal 23 may correspond to parity bit columns, and where each of vectors $y_2$ and $y_1$ includes a respective set of information bits (e.g., information bit vectors).

For example, the decoder 505 may decode a first set of information bits to a first information bit vector associated with a parity bit column (e.g., a column index 29), and may decode a second set of information bits to a second information bit vector associated with a parity bit column (e.g., column index 27 or 21). The decoder may generate a respective estimate (e.g., based on an LLR value) for each bit (e.g., parity bit or information bit) in the sequence. In some cases, the decoder 505 may set an LLR to a value of zero for one or more punctured vectors of bits (e.g., a first 2Z bits) associated with the sequence 515 (e.g., a first vector and a second vector $\alpha$ and $\beta$ as described herein). The decoder 505 may estimate respective values of the one or more punctured vectors of bits based on setting the LLRs to zero.

Based on the decoding, the decoder 505 may output a decoded second sequence of bits (e.g., sequence 520 or sequence B) to a postprocessing component 510 (e.g., including estimated $\alpha$ and among other estimated vectors). The sequence 520 may be represented, for example, for the first lifted parity check matrix by estimated vector values $[\hat{\alpha}, \hat{\beta}, \hat{b}_3, \ldots, \hat{b}_{22}, \hat{b}_{23}, \ldots, \hat{b}_{26}, \hat{b}_2, \hat{b}_{28}, \hat{b}_1, \ldots]$, where vectors having an index greater than or equal 23 may be estimates of vectors corresponding to parity bit columns (e.g., parity bit vectors or information bit vectors corresponding to parity bit columns), and where each of estimated vectors $\hat{b}_2$ and $\hat{b}_1$ includes a respective set of information bits.

The postprocessing component 510 may reorder or adjust the sequence 520, for example, based on receiving and estimating sets of information bit vectors corresponding to respective parity bit columns, as described herein with reference to FIGS. 2-4. For example, the postprocessing component 510 may remove parity bit vectors from the sequence 520, including a first and second vector of the sequence 520 (e.g., $\alpha$ and $\beta$). The postprocessing component 510 may replace the values of the first vector (e.g., a parity bit vector) with the first set of information bits received via a corresponding information bit vector associated with a parity bit column of a base graph. The postprocessing component 510 may also reorder or replace the values of the second vector (e.g., a second parity bit vector) with the second set of information bits received via a corresponding information bit vector associated with a parity bit column of a base graph. Thus, the postprocessing component 510 may output an ordered sequence 525 of information bit vectors (e.g., starting with the first and second information bit vectors). The sequence 525 may be represented, for example, for the first lifted parity check matrix by vector values $[\hat{b}_1, \hat{b}_2, \hat{b}_3, \ldots, \hat{b}_{22}]$, where estimated vectors $\hat{b}_1$ and $\hat{b}_2$ may represent information bit vectors that each include a respective set of information bits (e.g., the first or second set of information bits).

Figure 6:
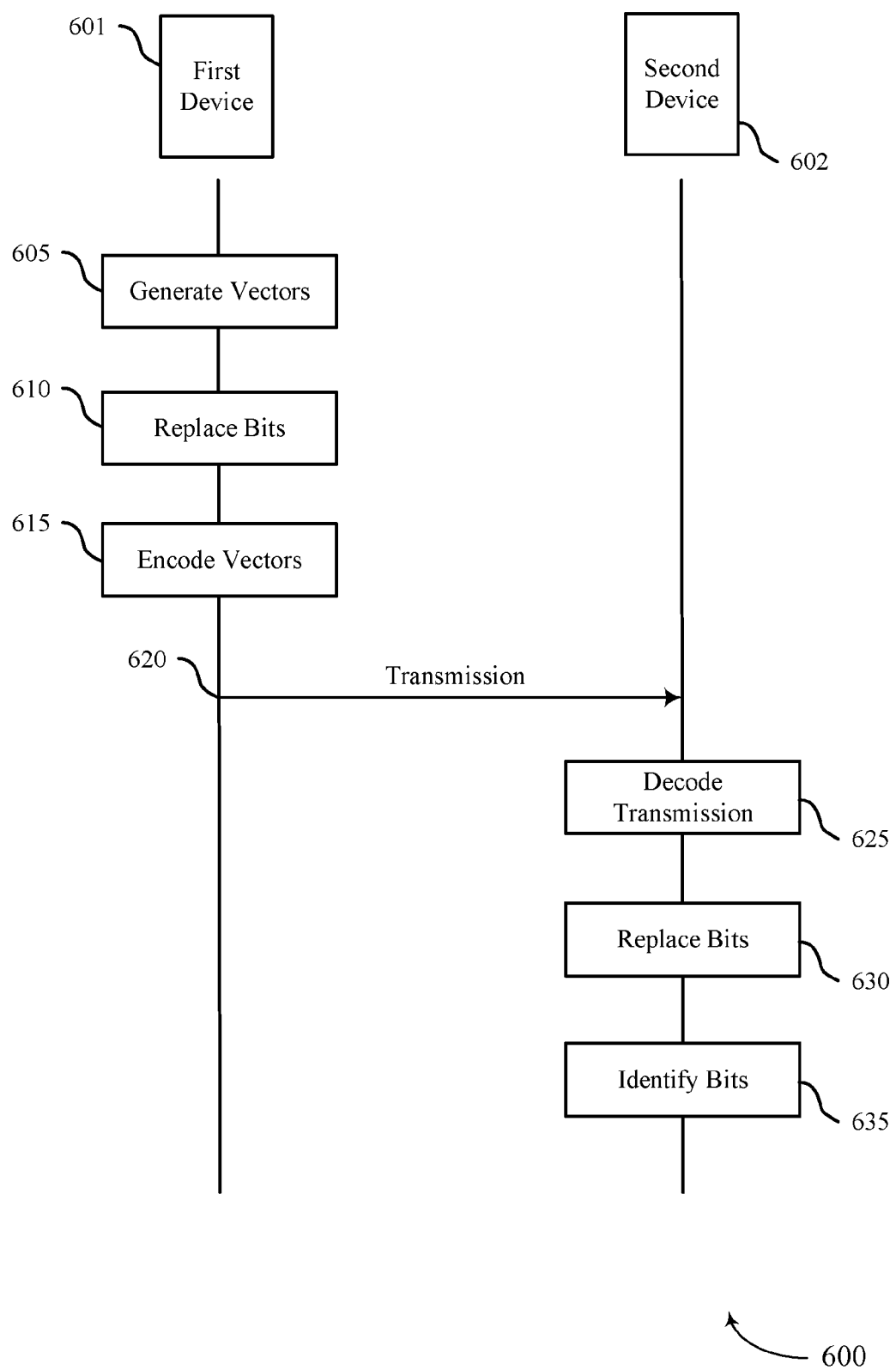
FIG. 6 illustrates an example of a process flow that supports bit replacing for LDPC encoding in accordance with aspects of the present disclosure.

FIG. 6 illustrates an example of a process flow 600 that supports bit replacing for LDPC encoding in accordance with aspects of the present disclosure. In some examples, process flow 600 may implement or be implemented by some aspects of wireless communications system 100 or 200. In some examples, process flow 600 may additionally or alternatively implement or be implemented by some aspects of block diagram 300 or 500, as well as base graph 401 or 402. For example, process flow 600 may be implemented by a first wireless device 601 and a second wireless device, which may represent respective examples of a wireless device described with reference to FIGS. 1-5. As described herein, a wireless device may represent a UE 115, a base station 105, or any other device operable to perform wireless communications.

In the following description of process flow 600, the operations may be performed in a different order than the order shown, or the operations performed by the first wireless device 601 and the second wireless device 602 may be performed in different orders or at different times. For example, specific operations may also be left out of process flow 600, or other operations may be added to process flow 600. Although the first wireless device 601 and the second wireless device 602 are shown performing the operations of process flow 600, some aspects of some operations may also be performed by one or more other wireless devices.

At 605, the first wireless device 601 may generate a first set of multiple vectors (e.g., information bit vectors) each including a respective set of information bits having a first quantity. Each vector of the first set may be associated with a respective index (e.g., column index) indicating an order of the first set of multiple vectors with respect to a lifted parity check matrix and/or base parity check matrix. As described herein, the first set of multiple vectors may be generated using an amplitude shaping process on the information bits, such as a PAS process.

At 610, the first wireless device 601 may replace a first set of information bits of a first vector of the first set of multiple vectors with a first set of parity bits having the first quantity. The first set of parity bits may be based on the first set of information bits, and may be determined, for example, using an equation or technique associated with a lifted parity check matrix that includes the first set of information bits (e.g., as represented by Equation (1) or Equation (3) described herein). In some cases, the first wireless device 601 may also replace a second set of information bits of a second vector of the first set of multiple vectors with a second set of parity bits having the first quantity. The second set of parity bits may be based on the second set of information bits, and may be determined, for example, using an equation or technique associated with a lifted parity check matrix that includes the second set of information bits (e.g., as represented by Equation (2) or Equation (4) described herein).

At 615, the first wireless device 601 may encode the first set of multiple vectors according to the lifted parity check matrix and the replacing (e.g., using an LDPC encoding process). For example, the first wireless device 601 may generate a second set of multiple vectors (e.g., parity bit vectors) each including a respective set of bits having the first quantity. The second set of multiple vectors may be generated using equations and vectors (e.g., information and/or parity bit vectors) indicated by the lifted parity check matrix (e.g., by columns of the lifted parity check matrix). The second set of multiple vectors may include a third vector that includes the second set of information bits and a fourth vector that includes the first set of information bits (e.g., each corresponding to one or more respective parity columns of the parity check matrix), based on replacing the second and first sets of information bits with the second and first sets of parity bits, respectively. After encoding the information bit vectors, the first wireless device 601 may also puncture the first and second vectors (e.g., after generating the third and fourth vectors using the values of the first and second vectors).

At 620, the first wireless device 601 may perform a transmission to the second wireless device 602 based on the encoding. The transmission may include, for example, the value of the first set of information bits at the fourth vector (e.g., corresponding to a parity bit column) and/or the value of the second set of information bits at the third vector (e.g., corresponding to a parity bit column).

At 625, the second wireless device 602 may decode the transmission (e.g., using an LDPC decoding process) into a first set of multiple vectors each including a respective set of bits having a first quantity and a second set of multiple vectors each including a respective set of bits having the first quantity. Each vector of the first set and the second set may be associated with a respective index (e.g., column index) indicating an order of the first set of multiple vectors and the second set of multiple vectors with respect to a lifted parity check matrix.

The second wireless device 602 may, for example, determine LLRs for each vector of the first set and the second set, and may further determine estimates of values of the information bits and parity bits, to respective vectors of the first set or second set (e.g., determine the estimates based on the respective LLRs). For example, the second wireless device 602 may decode the value (e.g., an estimate) of the first set of information bits to the fourth vector of the second set of multiple of vectors and may decode the value (e.g., an estimate) of the second set of information bits to the third vector of the second set of multiple vectors. In some cases, the second wireless device 602 may set an LLR of the first vector of the first set of multiple vectors and an LLR of the second vector of the first set of multiple vectors to a value of zero (e.g., based on the first wireless device 601 puncturing the values of the first vector and/or second vector), and may determine estimates for the first vector and the second vector based on the LLRs having a value of zero.

At 630, the second wireless device 602 may replace a first set of bits of the first vector (e.g., estimated based on an LLR of zero) with the first set of information bits of the fourth vector. The second wireless device 602 may also replace a second set of bits of the second vector (e.g., estimated based on an LLR of zero) with the second set of information bits of the third vector.

At 635, the second wireless device 602 may identify information bits (e.g., a set of multiple information bits) of the transmission based on the replacing. For example, the second wireless device 602 may identify the first set of information bits and/or the second set of information bits (e.g., among other information bits) based on replacing these sets of bits into the first or second vector (e.g., and corresponding column locations), respectively.

Figure 7:
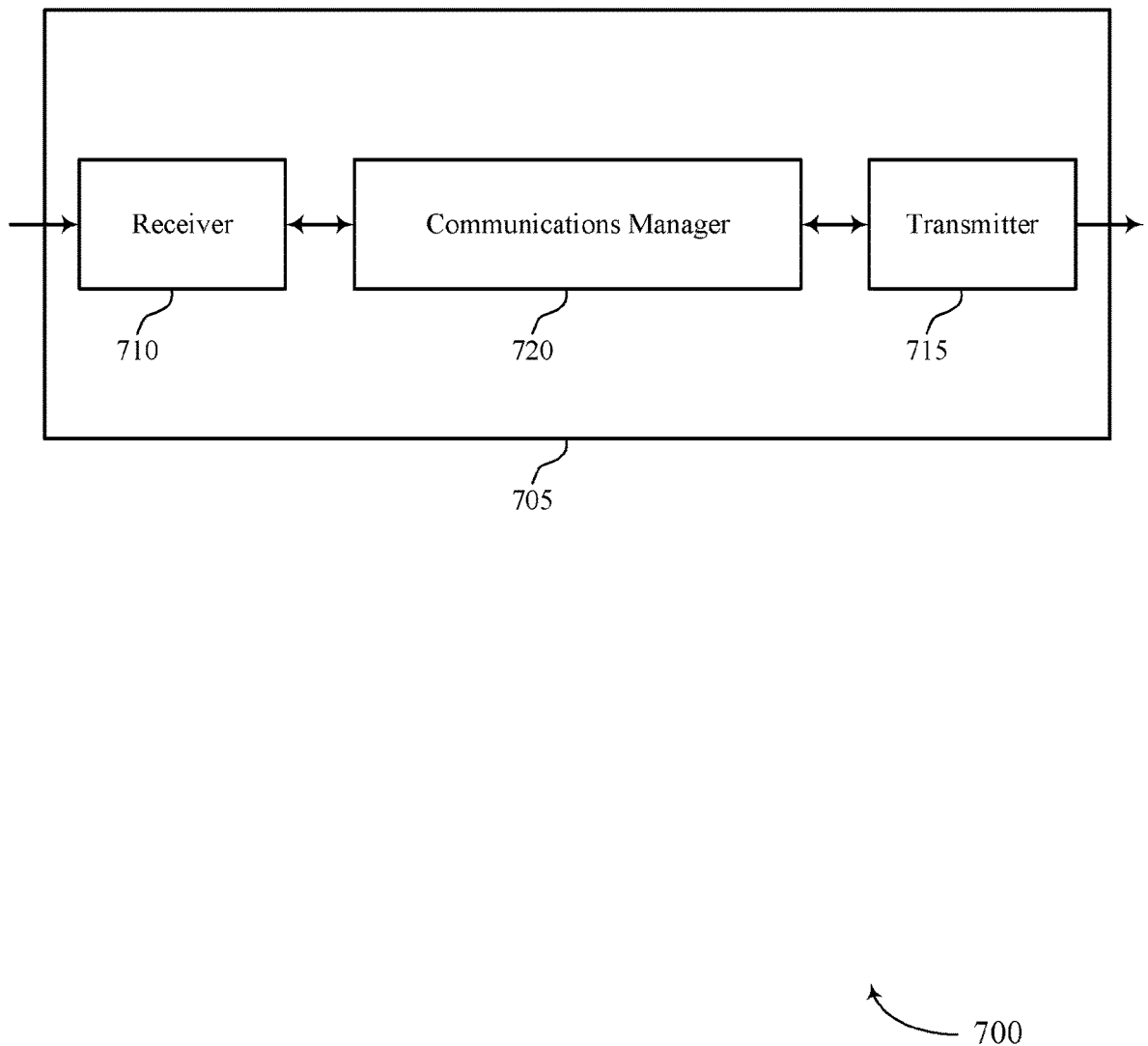
FIGS. 7 and 8 show block diagrams of devices that support bit replacing for LDPC encoding in accordance with aspects of the present disclosure.

FIG. 7 shows a block diagram 700 of a device 705 that supports bit replacing for LDPC encoding in accordance with aspects of the present disclosure. The device 705 may be an example of aspects of a UE 115 or a base station 105 as described herein. The device 705 may include a receiver 710, a transmitter 715, and a communications manager 720. The device 705 may also include a processor. Each of these components may be in communication with one another (e.g., via one or more buses).

The receiver 710 may provide a means for receiving information such as packets, user data, control information, or any combination thereof associated with various information channels (e.g., control channels, data channels, information channels related to bit replacing for LDPC encoding). Information may be passed on to other components of the device 705. The receiver 710 may utilize a single antenna or a set of multiple antennas.

The transmitter 715 may provide a means for transmitting signals generated by other components of the device 705. For example, the transmitter 715 may transmit information such as packets, user data, control information, or any combination thereof associated with various information channels (e.g., control channels, data channels, information channels related to bit replacing for LDPC encoding). In some examples, the transmitter 715 may be co-located with a receiver 710 in a transceiver module. The transmitter 715 may utilize a single antenna or a set of multiple antennas.

The communications manager 720, the receiver 710, the transmitter 715, or various combinations thereof or various components thereof may be examples of means for performing various aspects of bit replacing for LDPC encoding as described herein. For example, the communications manager 720, the receiver 710, the transmitter 715, or various combinations or components thereof may support a method for performing one or more of the functions described herein.

In some examples, the communications manager 720, the receiver 710, the transmitter 715, or various combinations or components thereof may be implemented in hardware (e.g., in communications management circuitry). The hardware may include a processor, a digital signal processor (DSP), an application-specific integrated circuit (ASIC), a field-programmable gate array (FPGA) or other programmable logic device, a discrete gate or transistor logic, discrete hardware components, or any combination thereof configured as or otherwise supporting a means for performing the functions described in the present disclosure. In some examples, a processor and memory coupled with the processor may be configured to perform one or more of the functions described herein (e.g., by executing, by the processor, instructions stored in the memory).

Additionally or alternatively, in some examples, the communications manager 720, the receiver 710, the transmitter 715, or various combinations or components thereof may be implemented in code (e.g., as communications management software or firmware) executed by a processor. If implemented in code executed by a processor, the functions of the communications manager 720, the receiver 710, the transmitter 715, or various combinations or components thereof may be performed by a general-purpose processor, a DSP, a central processing unit (CPU), an ASIC, an FPGA, or any combination of these or other programmable logic devices (e.g., configured as or otherwise supporting a means for performing the functions described in the present disclosure).

In some examples, the communications manager 720 may be configured to perform various operations (e.g., receiving, monitoring, transmitting) using or otherwise in cooperation with the receiver 710, the transmitter 715, or both. For example, the communications manager 720 may receive information from the receiver 710, send information to the transmitter 715, or be integrated in combination with the receiver 710, the transmitter 715, or both to receive information, transmit information, or perform various other operations as described herein.

The communications manager 720 may support wireless communication in accordance with examples as disclosed herein. For example, the communications manager 720 may be configured as or otherwise support a means for generating a first set of multiple vectors each including a respective set of information bits having a first quantity, where each vector of the first plurality is associated with a respective index indicating an order of the first set of multiple vectors with respect to a lifted parity check matrix. The communications manager 720 may be configured as or otherwise support a means for replacing a first set of information bits of a first vector of the first set of multiple vectors with a first set of parity bits having the first quantity, where the first set of parity bits is based on the first set of information bits. The communications manager 720 may be configured as or otherwise support a means for encoding the first set of multiple vectors according to the lifted parity check matrix and the replacing. The communications manager 720 may be configured as or otherwise support a means for performing, at a first wireless device, a transmission to a second wireless device based on the encoding.

Additionally or alternatively, the communications manager 720 may support wireless communication in accordance with examples as disclosed herein. For example, the communications manager 720 may be configured as or otherwise support a means for receiving a transmission from a first wireless device at a second wireless device. The communications manager 720 may be configured as or otherwise support a means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix. The communications manager 720 may be configured as or otherwise support a means for replacing a first set of bits of a first vector of the first set of multiple vectors with a first set of information bits of a fourth vector of the second set of multiple vectors, where the first set of information bits is associated with the first vector. The communications manager 720 may be configured as or otherwise support a means for identifying a set of multiple information bits of the transmission based on the replacing.

The actions performed by the communications manager 720, among other examples herein, may be implemented to realize one or more potential advantages. For example, communications manager 720 may increase available power and communication quality at a wireless device (e.g., a UE 115 or a base station) by increasing amplitude shaping gains at the wireless device. The increase in communication quality may result in increased link performance and decreased overhead based on using a preprocessing and/or postprocessing component for swapping bits. Accordingly, communications manager 720 may save power and increase battery life at a wireless device (e.g., a UE 115) by strategically increasing a quality of communications at a wireless device (e.g., a UE 115 or a base station 105).

Figure 8:
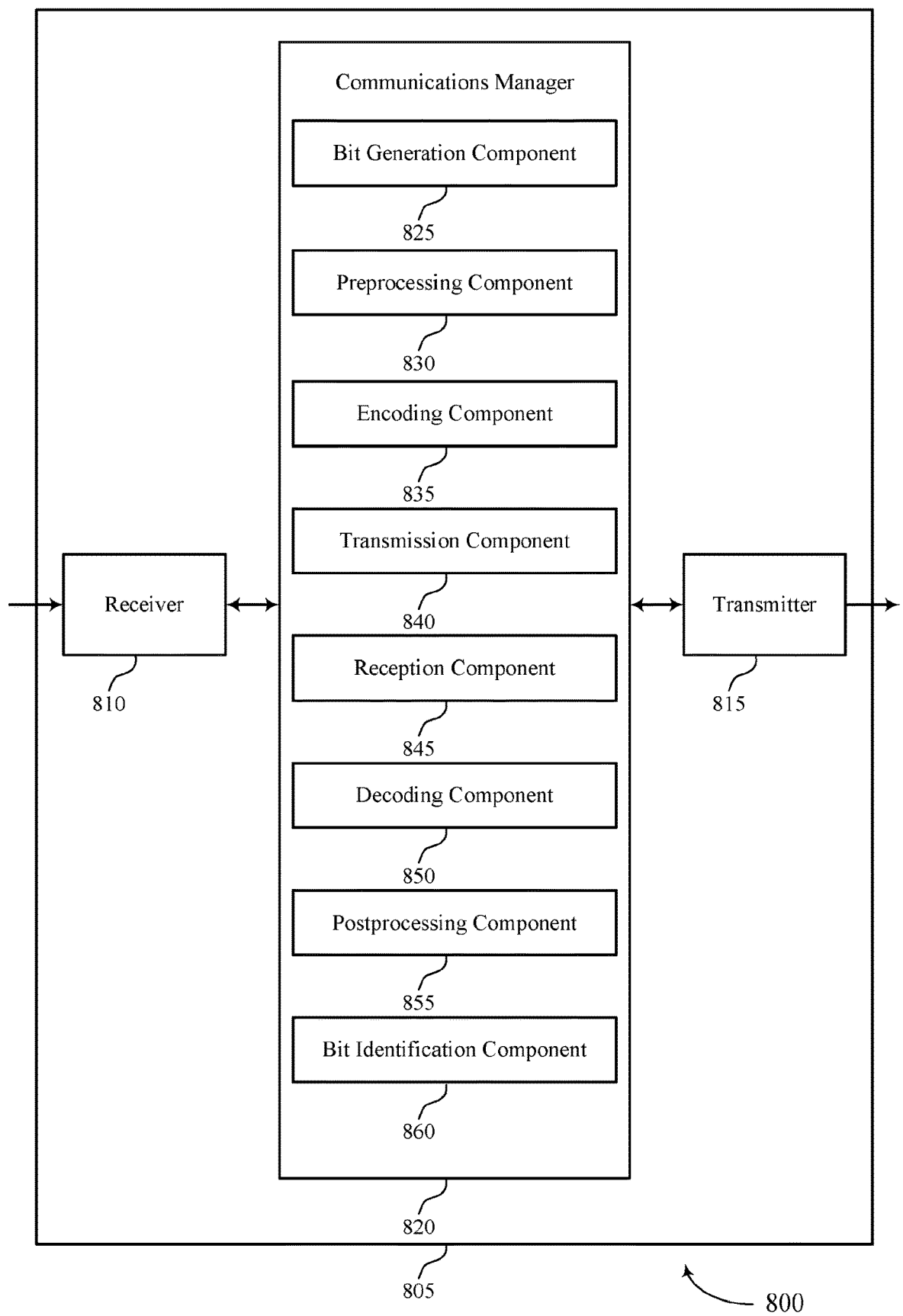

FIG. 8 shows a block diagram 800 of a device 805 that supports bit replacing for LDPC encoding in accordance with aspects of the present disclosure. The device 805 may be an example of aspects of a device 705, a UE 115, or a base station 105 as described herein. The device 805 may include a receiver 810, a transmitter 815, and a communications manager 820. The device 805 may also include a processor. Each of these components may be in communication with one another (e.g., via one or more buses).

The receiver 810 may provide a means for receiving information such as packets, user data, control information, or any combination thereof associated with various information channels (e.g., control channels, data channels, information channels related to bit replacing for LDPC encoding). Information may be passed on to other components of the device 805. The receiver 810 may utilize a single antenna or a set of multiple antennas.

The transmitter 815 may provide a means for transmitting signals generated by other components of the device 805. For example, the transmitter 815 may transmit information such as packets, user data, control information, or any combination thereof associated with various information channels (e.g., control channels, data channels, information channels related to bit replacing for LDPC encoding). In some examples, the transmitter 815 may be co-located with a receiver 810 in a transceiver module. The transmitter 815 may utilize a single antenna or a set of multiple antennas.

The device 805, or various components thereof, may be an example of means for performing various aspects of bit replacing for LDPC encoding as described herein. For example, the communications manager 820 may include a bit generation component 825, a preprocessing component 830, an encoding component 835, a transmission component 840, a reception component 845, a decoding component 850, a postprocessing component 855, a bit identification component 860, or any combination thereof. The communications manager 820 may be an example of aspects of a communications manager 720 as described herein. In some examples, the communications manager 820, or various components thereof, may be configured to perform various operations (e.g., receiving, monitoring, transmitting) using or otherwise in cooperation with the receiver 810, the transmitter 815, or both. For example, the communications manager 820 may receive information from the receiver 810, send information to the transmitter 815, or be integrated in combination with the receiver 810, the transmitter 815, or both to receive information, transmit information, or perform various other operations as described herein.

The communications manager 820 may support wireless communication in accordance with examples as disclosed herein. The bit generation component 825 may be configured as or otherwise support a means for generating a first set of multiple vectors each including a respective set of information bits having a first quantity, where each vector of the first plurality is associated with a respective index indicating an order of the first set of multiple vectors with respect to a lifted parity check matrix. The preprocessing component 830 may be configured as or otherwise support a means for replacing a first set of information bits of a first vector of the first set of multiple vectors with a first set of parity bits having the first quantity, where the first set of parity bits is based on the first set of information bits. The encoding component 835 may be configured as or otherwise support a means for encoding the first set of multiple vectors according to the lifted parity check matrix and the replacing. The transmission component 840 may be configured as or otherwise support a means for performing, at a first wireless device, a transmission to a second wireless device based on the encoding.

Additionally or alternatively, the communications manager 820 may support wireless communication in accordance with examples as disclosed herein. The reception component 845 may be configured as or otherwise support a means for receiving a transmission from a first wireless device at a second wireless device. The decoding component 850 may be configured as or otherwise support a means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix. The postprocessing component 855 may be configured as or otherwise support a means for replacing a first set of bits of a first vector of the first set of multiple vectors with a first set of information bits of a fourth vector of the second set of multiple vectors, where the first set of information bits is associated with the first vector. The bit identification component 860 may be configured as or otherwise support a means for identifying a set of multiple information bits of the transmission based on the replacing.

A processor of a wireless device (e.g., controlling the receiver 810, the transmitter 815, or the transceiver 1015 as described with reference to FIG. 10) may increase available battery power and communication quality. The increased communication quality may increase available battery power and throughput (e.g., via implementation of system components described with reference to FIG. 9) compared to other systems and techniques, for example, that do not support bit replacing for encoding or decoding. Further, the processor of the wireless device may identify one or more aspects of a bit swapping configuration to perform the bit swapping, which may result in increased communication quality, as well as save power and increase battery life at the wireless device (e.g., by strategically supporting increased communication quality by performing the bit swapping before encoding or after decoding), among other benefits.

Figure 9:
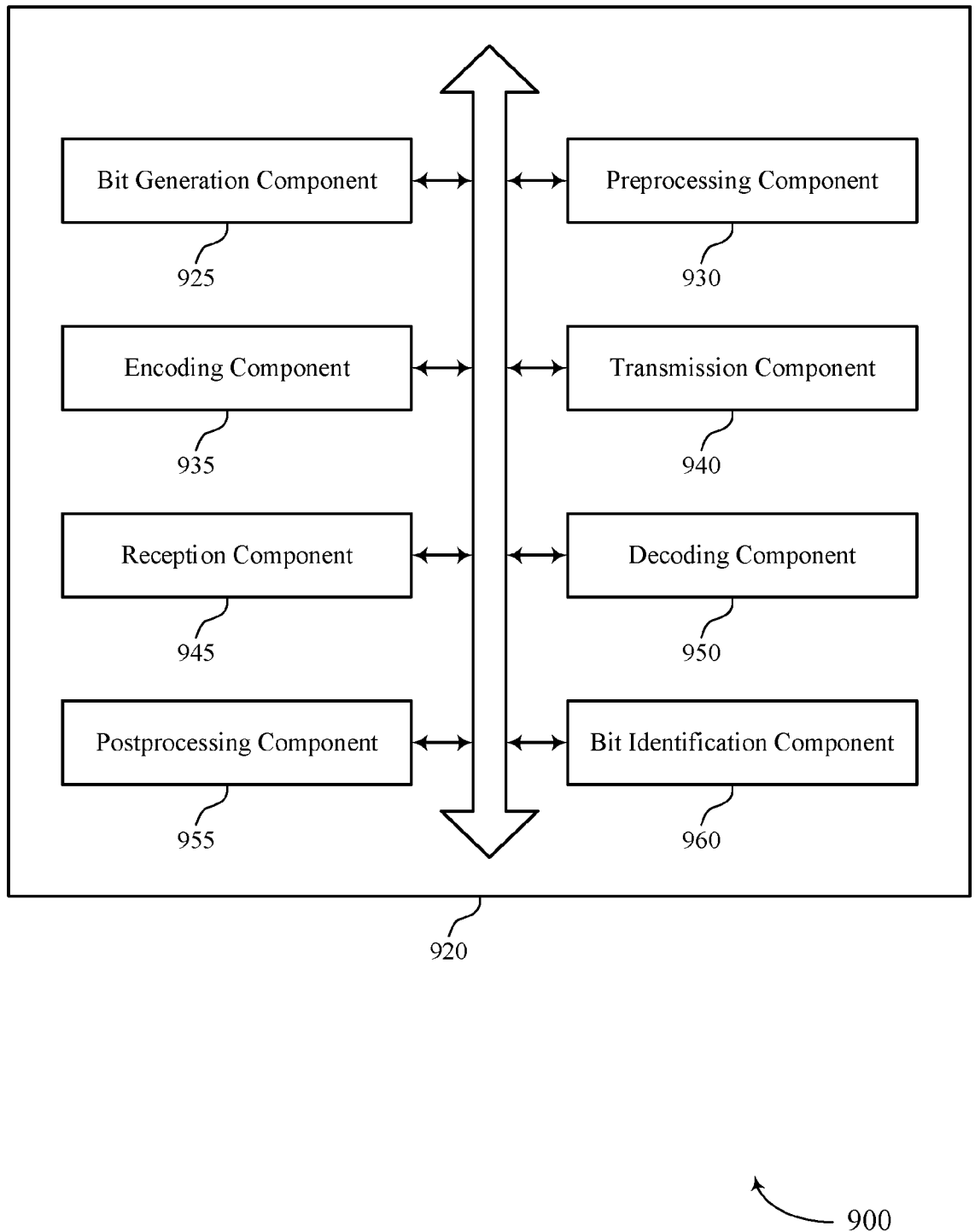
FIG. 9 shows a block diagram of a communications manager that supports bit replacing for LDPC encoding in accordance with aspects of the present disclosure.

FIG. 9 shows a block diagram 900 of a communications manager 920 that supports bit replacing for LDPC encoding in accordance with aspects of the present disclosure. The communications manager 920 may be an example of aspects of a communications manager 720, a communications manager 820, or both, as described herein. The communications manager 920, or various components thereof, may be an example of means for performing various aspects of bit replacing for LDPC encoding as described herein. For example, the communications manager 920 may include a bit generation component 925, a preprocessing component 930, an encoding component 935, a transmission component 940, a reception component 945, a decoding component 950, a postprocessing component 955, a bit identification component 960, or any combination thereof. Each of these components may communicate, directly or indirectly, with one another (e.g., via one or more buses).

The communications manager 920 may support wireless communication in accordance with examples as disclosed herein. The bit generation component 925 may be configured as or otherwise support a means for generating a first set of multiple vectors each including a respective set of information bits having a first quantity, where each vector of the first plurality is associated with a respective index indicating an order of the first set of multiple vectors with respect to a lifted parity check matrix. The preprocessing component 930 may be configured as or otherwise support a means for replacing a first set of information bits of a first vector of the first set of multiple vectors with a first set of parity bits having the first quantity, where the first set of parity bits is based on the first set of information bits. The encoding component 935 may be configured as or otherwise support a means for encoding the first set of multiple vectors according to the lifted parity check matrix and the replacing. The transmission component 940 may be configured as or otherwise support a means for performing, at a first wireless device, a transmission to a second wireless device based on the encoding.

In some examples, the preprocessing component 930 may be configured as or otherwise support a means for replacing a second set of information bits of a second vector of the first set of multiple vectors with a second set of parity bits having the first quantity, where the second set of parity bits is based on the second set of information bits. In some examples, the preprocessing component 930 may be configured as or otherwise support a means for determining the second set of parity bits based on the second set of information bits and the first set of parity bits, where replacing the second set of information bits is based on determining the second set of parity bits. In some examples, the preprocessing component 930 may be configured as or otherwise support a means for determining the second set of parity bits based on the second set of information bits, the first set of parity bits, and a group of one or more third sets of information bits each corresponding to a respective vector of the first set of multiple vectors, where replacing the second set of information bits is based on determining the second set of parity bits.

In some examples, to support encoding the first set of multiple vectors, the encoding component 935 may be configured as or otherwise support a means for generating a second set of multiple vectors each including a respective set of bits having the first quantity, the second set of multiple vectors including a third vector that includes the second set of information bits based on replacing the second set of information bits of the second vector. In some examples, the transmission includes the second set of information bits based on generating the second plurality of vectors. In some examples, the encoding component 935 may be configured as or otherwise support a means for puncturing the second vector after generating the second set of multiple vectors.

In some examples, the preprocessing component 930 may be configured as or otherwise support a means for determining the first set of parity bits based on the first set of information bits and a group of one or more second sets of information bits each corresponding to a respective vector of the first set of multiple vectors, where replacing the first set of information bits is based on determining the first set of parity bits. In some examples, to support encoding the first set of multiple vectors, the encoding component 935 may be configured as or otherwise support a means for generating a second set of multiple vectors each including a respective set of bits having the first quantity, the second set of multiple vectors including a fourth vector that includes the first set of information bits based on replacing the first set of information bits of the first vector. In some examples, the transmission includes the first set of information bits based on the encoding.

In some examples, the encoding component 935 may be configured as or otherwise support a means for puncturing the first vector after generating the second set of multiple vectors. In some examples, to support encoding the first set of multiple vectors, the encoding component 935 may be configured as or otherwise support a means for performing an LDPC encoding process on the first set of multiple vectors.

In some examples, to support generating the first set of multiple vectors, the bit generation component 925 may be configured as or otherwise support a means for performing an amplitude shaping process on the first set of multiple vectors.

In some examples, the lifted parity check matrix includes a set of first columns, each first column associated with a respective index corresponding to a vector of the first set of multiple vectors. In some examples, the lifted parity check matrix includes a set of second columns, each second column associated with a respective index corresponding to a vector of a second set of multiple vectors each including a respective set of parity bits having the first quantity. In some examples, the lifted parity check matrix includes a set of rows, each row corresponding to a parity check equation for generating a respective vector of the second set of multiple vectors.

Additionally or alternatively, the communications manager 920 may support wireless communication in accordance with examples as disclosed herein. The reception component 945 may be configured as or otherwise support a means for receiving a transmission from a first wireless device at a second wireless device. The decoding component 950 may be configured as or otherwise support a means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix. The postprocessing component 955 may be configured as or otherwise support a means for replacing a first set of bits of a first vector of the first set of multiple vectors with a first set of information bits of a fourth vector of the second set of multiple vectors, where the first set of information bits is associated with the first vector. The bit identification component 960 may be configured as or otherwise support a means for identifying a set of multiple information bits of the transmission based on the replacing.

In some examples, to support decoding the transmission, the decoding component 950 may be configured as or otherwise support a means for decoding the first set of information bits to the fourth vector. In some examples, to support decoding the transmission, the decoding component 950 may be configured as or otherwise support a means for setting an LLR of the first vector to a value of zero, where the first set of bits of the first vector is determined based on setting the LLR of the first vector to a value of zero. In some examples, the fourth vector is associated with a first parity bit column of the lifted parity check matrix.

In some examples, to support decoding the transmission, the decoding component 950 may be configured as or otherwise support a means for decoding a second set of information bits to a third vector of the second set of multiple vectors. In some examples, the third vector is associated with a second parity bit column of the lifted parity check matrix.

In some examples, the postprocessing component 955 may be configured as or otherwise support a means for replacing a second set of bits of a second vector of the first set of multiple vectors with the second set of information bits. In some examples, to support decoding the transmission, the decoding component 950 may be configured as or otherwise support a means for setting an LLR of the second vector to a value of zero, where the second set of bits of the second vector is determined based on setting the LLR of the second vector to a value of zero.

In some examples, to support decoding the transmission, the decoding component 950 may be configured as or otherwise support a means for performing an LDPC decoding process on the transmission.

In some examples, the lifted parity check matrix may include a set of first columns, each first column associated with a respective index corresponding to a vector of the first set of multiple vectors. In some examples, the lifted parity check matrix may include a set of second columns, each second column associated with a respective index corresponding to a vector of the second set of multiple vectors. In some examples, the lifted parity check matrix may include a set of rows, each row corresponding to a parity check equation for generating a respective vector of the second set of multiple vectors.

Figure 10:
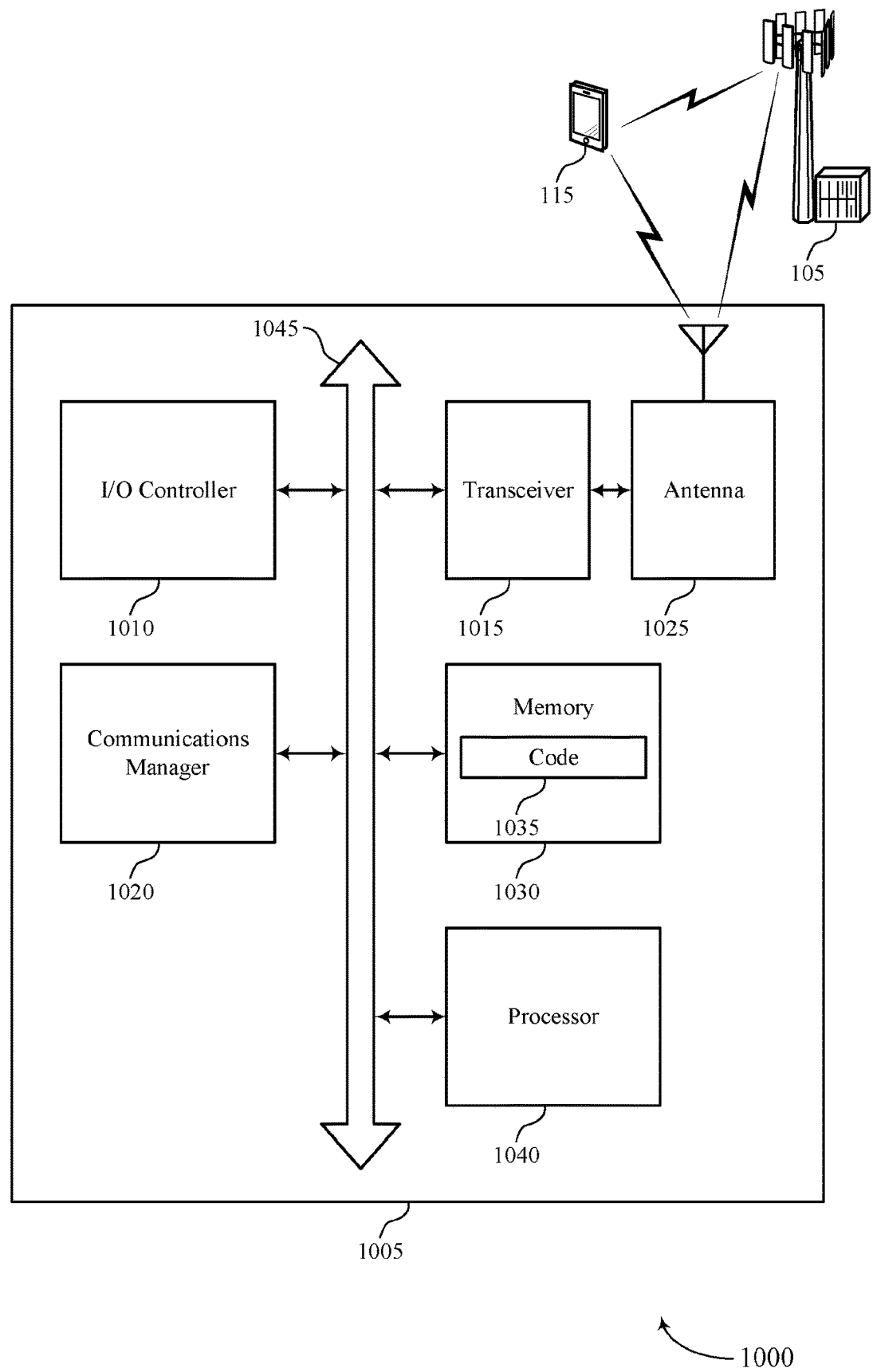
FIG. 10 shows a diagram of a system including a UE that supports bit replacing for LDPC encoding in accordance with aspects of the present disclosure.

FIG. 10 shows a diagram of a system 1000 including a device 1005 that supports bit replacing for LDPC encoding in accordance with aspects of the present disclosure. The device 1005 may be an example of or include the components of a device 705, a device 805, or a UE 115 as described herein. The device 1005 may communicate wirelessly with one or more base stations 105, UEs 115, or any combination thereof. The device 1005 may include components for bi-directional voice and data communications including components for transmitting and receiving communications, such as a communications manager 1020, an input/output (I/O) controller 1010, a transceiver 1015, an antenna 1025, a memory 1030, code 1035, and a processor 1040. These components may be in electronic communication or otherwise coupled (e.g., operatively, communicatively, functionally, electronically, electrically) via one or more buses (e.g., a bus 1045).

The I/O controller 1010 may manage input and output signals for the device 1005. The I/O controller 1010 may also manage peripherals not integrated into the device 1005. In some cases, the I/O controller 1010 may represent a physical connection or port to an external peripheral. In some cases, the I/O controller 1010 may utilize an operating system such as iOS®, ANDROID®, MS-DOS®, MS-WINDOWS®, OS/2®, UNIX®, LINUX®, or another known operating system. Additionally or alternatively, the I/O controller 1010 may represent or interact with a modem, a keyboard, a mouse, a touchscreen, or a similar device. In some cases, the I/O controller 1010 may be implemented as part of a processor, such as the processor 1040. In some cases, a user may interact with the device 1005 via the I/O controller 1010 or via hardware components controlled by the I/O controller 1010.

In some cases, the device 1005 may include a single antenna 1025. However, in some other cases, the device 1005 may have more than one antenna 1025, which may be capable of concurrently transmitting or receiving multiple wireless transmissions. The transceiver 1015 may communicate bi-directionally, via the one or more antennas 1025, wired, or wireless links as described herein. For example, the transceiver 1015 may represent a wireless transceiver and may communicate bi-directionally with another wireless transceiver. The transceiver 1015 may also include a modem to modulate the packets, to provide the modulated packets to one or more antennas 1025 for transmission, and to demodulate packets received from the one or more antennas 1025. The transceiver 1015, or the transceiver 1015 and one or more antennas 1025, may be an example of a transmitter 715, a transmitter 815, a receiver 710, a receiver 810, or any combination thereof or component thereof, as described herein.

The memory 1030 may include random access memory (RAM) and read-only memory (ROM). The memory 1030 may store computer-readable, computer-executable code 1035 including instructions that, when executed by the processor 1040, cause the device 1005 to perform various functions described herein. The code 1035 may be stored in a non-transitory computer-readable medium such as system memory or another type of memory. In some cases, the code 1035 may not be directly executable by the processor 1040 but may cause a computer (e.g., when compiled and executed) to perform functions described herein. In some cases, the memory 1030 may contain, among other things, a basic I/O system (BIOS) which may control basic hardware or software operation such as the interaction with peripheral components or devices.

The processor 1040 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In some other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting bit replacing for LDPC encoding). For example, the device 1005 or a component of the device 1005 may include a processor 1040 and memory 1030 coupled to the processor 1040, the processor 1040 and memory 1030 configured to perform various functions described herein.

The communications manager 1020 may support wireless communication in accordance with examples as disclosed herein. For example, the communications manager 1020 may be configured as or otherwise support a means for generating a first set of multiple vectors each including a respective set of information bits having a first quantity, where each vector of the first plurality is associated with a respective index indicating an order of the first set of multiple vectors with respect to a lifted parity check matrix. The communications manager 1020 may be configured as or otherwise support a means for replacing a first set of information bits of a first vector of the first set of multiple vectors with a first set of parity bits having the first quantity, where the first set of parity bits is based on the first set of information bits. The communications manager 1020 may be configured as or otherwise support a means for encoding the first set of multiple vectors according to the lifted parity check matrix and the replacing. The communications manager 1020 may be configured as or otherwise support a means for performing, at a first wireless device, a transmission to a second wireless device based on the encoding.

Additionally or alternatively, the communications manager 1020 may support wireless communication in accordance with examples as disclosed herein. For example, the communications manager 1020 may be configured as or otherwise support a means for receiving a transmission from a first wireless device at a second wireless device. The communications manager 1020 may be configured as or otherwise support a means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix. The communications manager 1020 may be configured as or otherwise support a means for replacing a first set of bits of a first vector of the first set of multiple vectors with a first set of information bits of a fourth vector of the second set of multiple vectors, where the first set of information bits is associated with the first vector. The communications manager 1020 may be configured as or otherwise support a means for identifying a set of multiple information bits of the transmission based on the replacing.

In some examples, the communications manager 1020 may be configured to perform various operations (e.g., receiving, monitoring, transmitting) using or otherwise in cooperation with the transceiver 1015, the one or more antennas 1025, or any combination thereof. Although the communications manager 1020 is illustrated as a separate component, in some examples, one or more functions described with reference to the communications manager 1020 may be supported by or performed by the processor 1040, the memory 1030, the code 1035, or any combination thereof. For example, the code 1035 may include instructions executable by the processor 1040 to cause the device 1005 to perform various aspects of bit replacing for LDPC encoding as described herein, or the processor 1040 and the memory 1030 may be otherwise configured to perform or support such operations.

Figure 11:
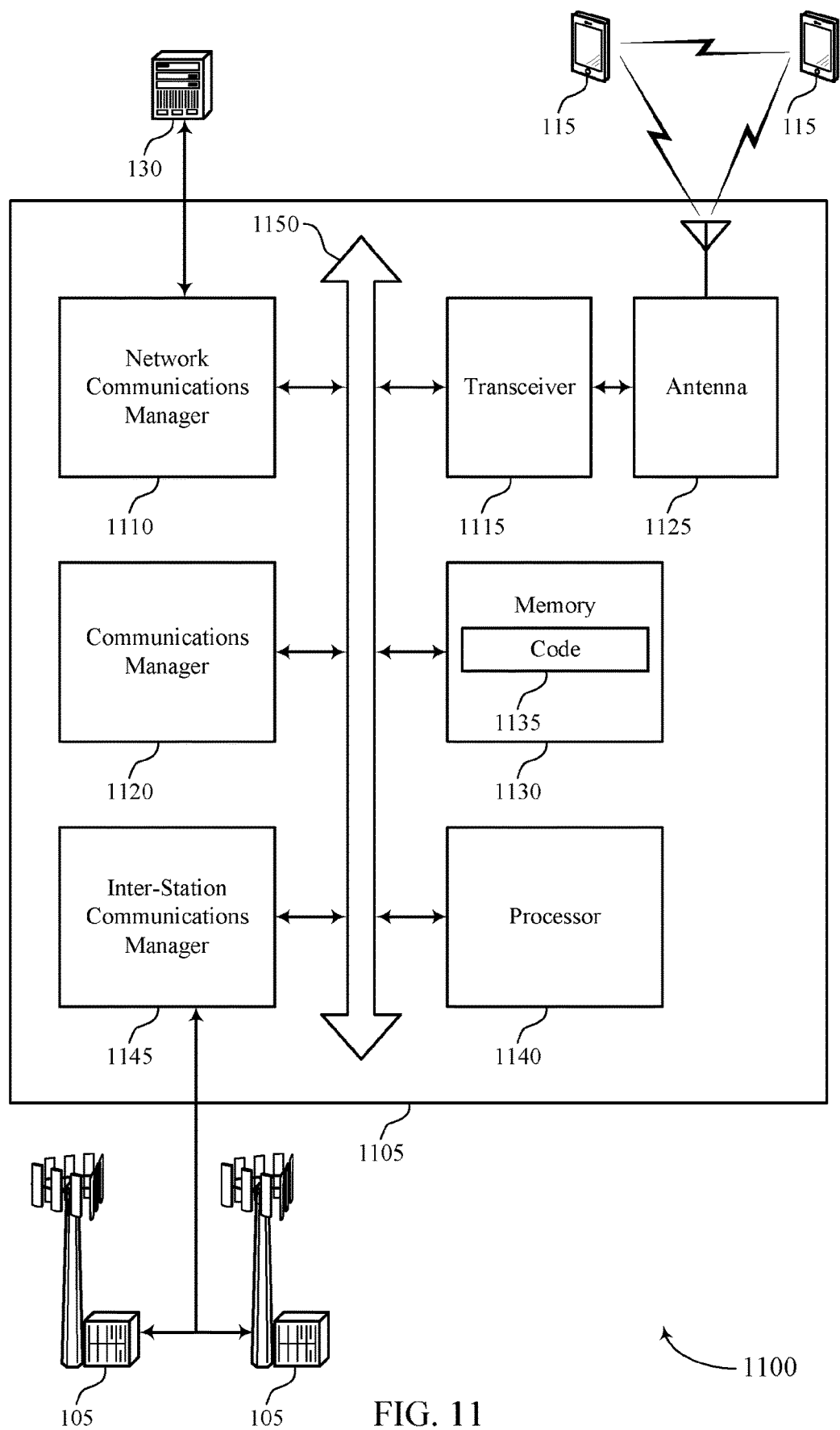
FIG. 11 shows a diagram of a system including a base station that supports bit replacing for LDPC encoding in accordance with aspects of the present disclosure.

FIG. 11 shows a diagram of a system 1100 including a device 1105 that supports bit replacing for LDPC encoding in accordance with aspects of the present disclosure. The device 1105 may be an example of or include the components of a device 705, a device 805, or a base station 105 as described herein. The device 1105 may communicate wirelessly with one or more base stations 105, UEs 115, or any combination thereof. The device 1105 may include components for bi-directional voice and data communications including components for transmitting and receiving communications, such as a communications manager 1120, a network communications manager 1110, a transceiver 1115, an antenna 1125, a memory 1130, code 1135, a processor 1140, and an inter-station communications manager 1145. These components may be in electronic communication or otherwise coupled (e.g., operatively, communicatively, functionally, electronically, electrically) via one or more buses (e.g., a bus 1150).

The network communications manager 1110 may manage communications with a core network 130 (e.g., via one or more wired backhaul links). For example, the network communications manager 1110 may manage the transfer of data communications for client devices, such as one or more UEs 115.

In some cases, the device 1105 may include a single antenna 1125. However, in some other cases the device 1105 may have more than one antenna 1125, which may be capable of concurrently transmitting or receiving multiple wireless transmissions. The transceiver 1115 may communicate bi-directionally, via the one or more antennas 1125, wired, or wireless links as described herein. For example, the transceiver 1115 may represent a wireless transceiver and may communicate bi-directionally with another wireless transceiver. The transceiver 1115 may also include a modem to modulate the packets, to provide the modulated packets to one or more antennas 1125 for transmission, and to demodulate packets received from the one or more antennas 1125. The transceiver 1115, or the transceiver 1115 and one or more antennas 1125, may be an example of a transmitter 715, a transmitter 815, a receiver 710, a receiver 810, or any combination thereof or component thereof, as described herein.

The memory 1130 may include RAM and ROM. The memory 1130 may store computer-readable, computer-executable code 1135 including instructions that, when executed by the processor 1140, cause the device 1105 to perform various functions described herein. The code 1135 may be stored in a non-transitory computer-readable medium such as system memory or another type of memory. In some cases, the code 1135 may not be directly executable by the processor 1140 but may cause a computer (e.g., when compiled and executed) to perform functions described herein. In some cases, the memory 1130 may contain, among other things, a BIOS which may control basic hardware or software operation such as the interaction with peripheral components or devices.

The processor 1140 may include an intelligent hardware device (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1140 may be configured to operate a memory array using a memory controller. In some other cases, a memory controller may be integrated into the processor 1140. The processor 1140 may be configured to execute computer-readable instructions stored in a memory (e.g., the memory 1130) to cause the device 1105 to perform various functions (e.g., functions or tasks supporting bit replacing for LDPC encoding). For example, the device 1105 or a component of the device 1105 may include a processor 1140 and memory 1130 coupled to the processor 1140, the processor 1140 and memory 1130 configured to perform various functions described herein.

The inter-station communications manager 1145 may manage communications with other base stations 105, and may include a controller or scheduler for controlling communications with UEs 115 in cooperation with other base stations 105. For example, the inter-station communications manager 1145 may coordinate scheduling for transmissions to UEs 115 for various interference mitigation techniques such as beamforming or joint transmission. In some examples, the inter-station communications manager 1145 may provide an X2 interface within an LTE/LTE-A wireless communications network technology to provide communication between base stations 105.

The communications manager 1120 may support wireless communication in accordance with examples as disclosed herein. For example, the communications manager 1120 may be configured as or otherwise support a means for generating a first set of multiple vectors each including a respective set of information bits having a first quantity, where each vector of the first plurality is associated with a respective index indicating an order of the first set of multiple vectors with respect to a lifted parity check matrix. The communications manager 1120 may be configured as or otherwise support a means for replacing a first set of information bits of a first vector of the first set of multiple vectors with a first set of parity bits having the first quantity, where the first set of parity bits is based on the first set of information bits. The communications manager 1120 may be configured as or otherwise support a means for encoding the first set of multiple vectors according to the lifted parity check matrix and the replacing. The communications manager 1120 may be configured as or otherwise support a means for performing, at a first wireless device, a transmission to a second wireless device based on the encoding.

Additionally or alternatively, the communications manager 1120 may support wireless communication in accordance with examples as disclosed herein. For example, the communications manager 1120 may be configured as or otherwise support a means for receiving a transmission from a first wireless device at a second wireless device. The communications manager 1120 may be configured as or otherwise support a means for decoding the transmission into a first set of multiple vectors each including a respective set of bits having a first quantity and a second set of multiple vectors each including a respective set of bits having the first quantity, where each vector of the first plurality and the second plurality is associated with a respective index indicating an order of the first set of multiple vectors and the second set of multiple vectors with respect to a lifted parity check matrix. The communications manager 1120 may be configured as or otherwise support a means for replacing a first set of bits of a first vector of the first set of multiple vectors with a first set of information bits of a fourth vector of the second set of multiple vectors, where the first set of information bits is associated with the first vector. The communications manager 1120 may be configured as or otherwise support a means for identifying a set of multiple information bits of the transmission based on the replacing.

In some examples, the communications manager 1120 may be configured to perform various operations (e.g., receiving, monitoring, transmitting) using or otherwise in cooperation with the transceiver 1115, the one or more antennas 1125, or any combination thereof. Although the communications manager 1120 is illustrated as a separate component, in some examples, one or more functions described with reference to the communications manager 1120 may be supported by or performed by the processor 1140, the memory 1130, the code 1135, or any combination thereof. For example, the code 1135 may include instructions executable by the processor 1140 to cause the device 1105 to perform various aspects of bit replacing for LDPC encoding as described herein, or the processor 1140 and the memory 1130 may be otherwise configured to perform or support such operations.

Figure 12:
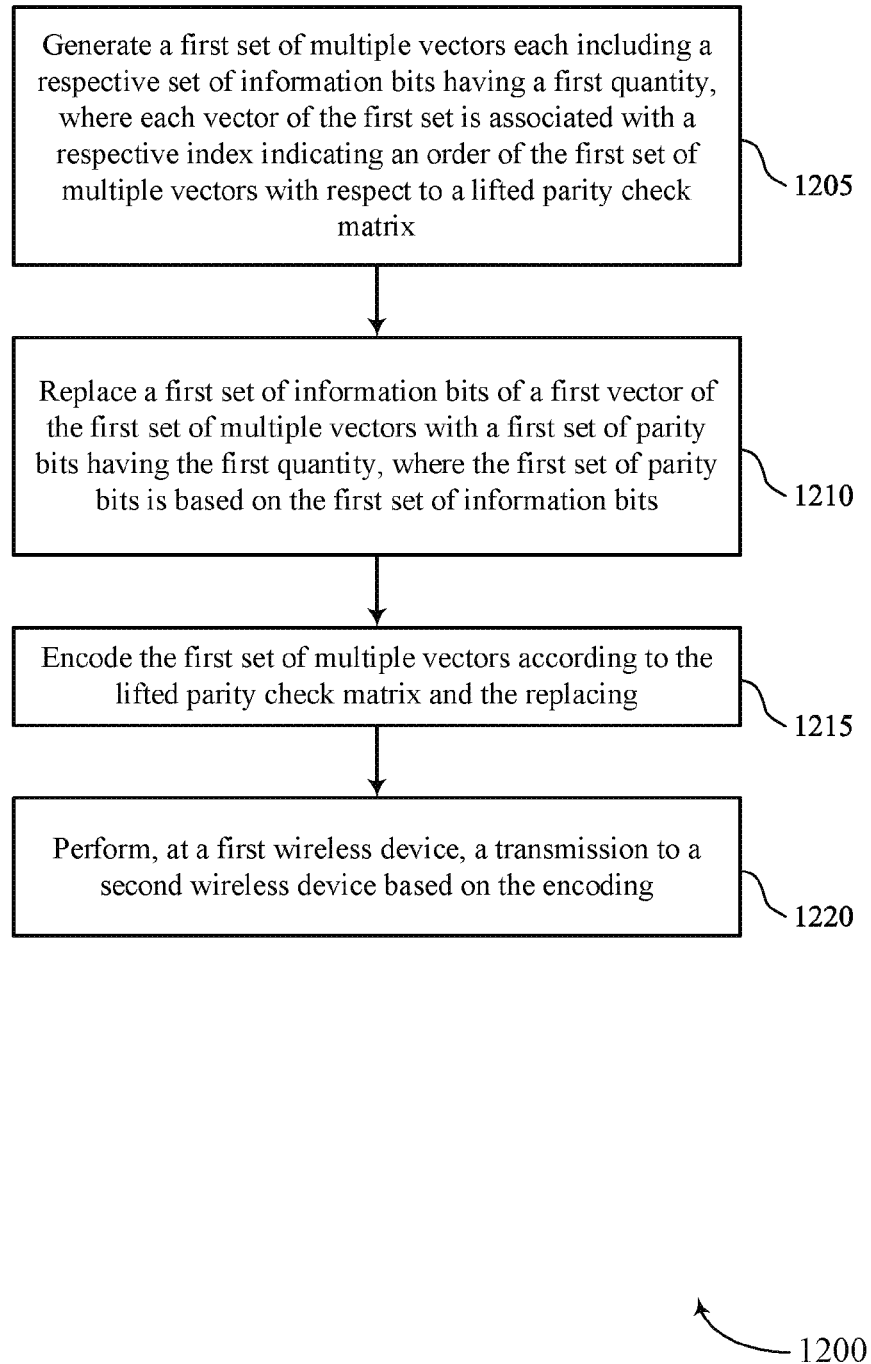
FIGS. 12 through 15 show flowcharts illustrating methods that support bit replacing for LDPC encoding in accordance with aspects of the present disclosure.

FIG. 12 shows a flowchart illustrating a method 1200 that supports bit replacing for LDPC encoding in accordance with aspects of the present disclosure. The operations of the method 1200 may be implemented by a UE or a base station or its components as described herein. For example, the operations of the method 1200 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1205, the method may include generating a first set of multiple vectors each including a respective set of information bits having a first quantity, where each vector of the first set is associated with a respective index indicating an order of the first set of multiple vectors with respect to a lifted parity check matrix. The operations of 1205 may be performed in accordance with examples as disclosed herein. In some examples, aspects of the operations of 1205 may be performed by a bit generation component 925 as described with reference to FIG. 9.

At 1210, the method may include replacing a first set of information bits of a first vector of the first set of multiple vectors with a first set of parity bits having the first quantity, where the first set of parity bits is based on the first set of information bits. The operations of 1210 may be performed in accordance with examples as disclosed herein. In some examples, aspects of the operations of 1210 may be performed by a preprocessing component 930 as described with reference to FIG. 9.

At 1215, the method may include encoding the first set of multiple vectors according to the lifted parity check matrix and the replacing. The operations of 1215 may be performed in accordance with examples as disclosed herein. In some examples, aspects of the operations of 1215 may be performed by an encoding component 935 as described with reference to FIG. 9.

At 1220, the method may include performing, at a first wireless device, a transmission to a second wireless device based on the encoding. The operations of 1220 may be performed in accordance with examples as disclosed herein. In some examples, aspects of the operations of 1220 may be performed by a transmission component 940 as described with reference to FIG. 9.

Figure 13:
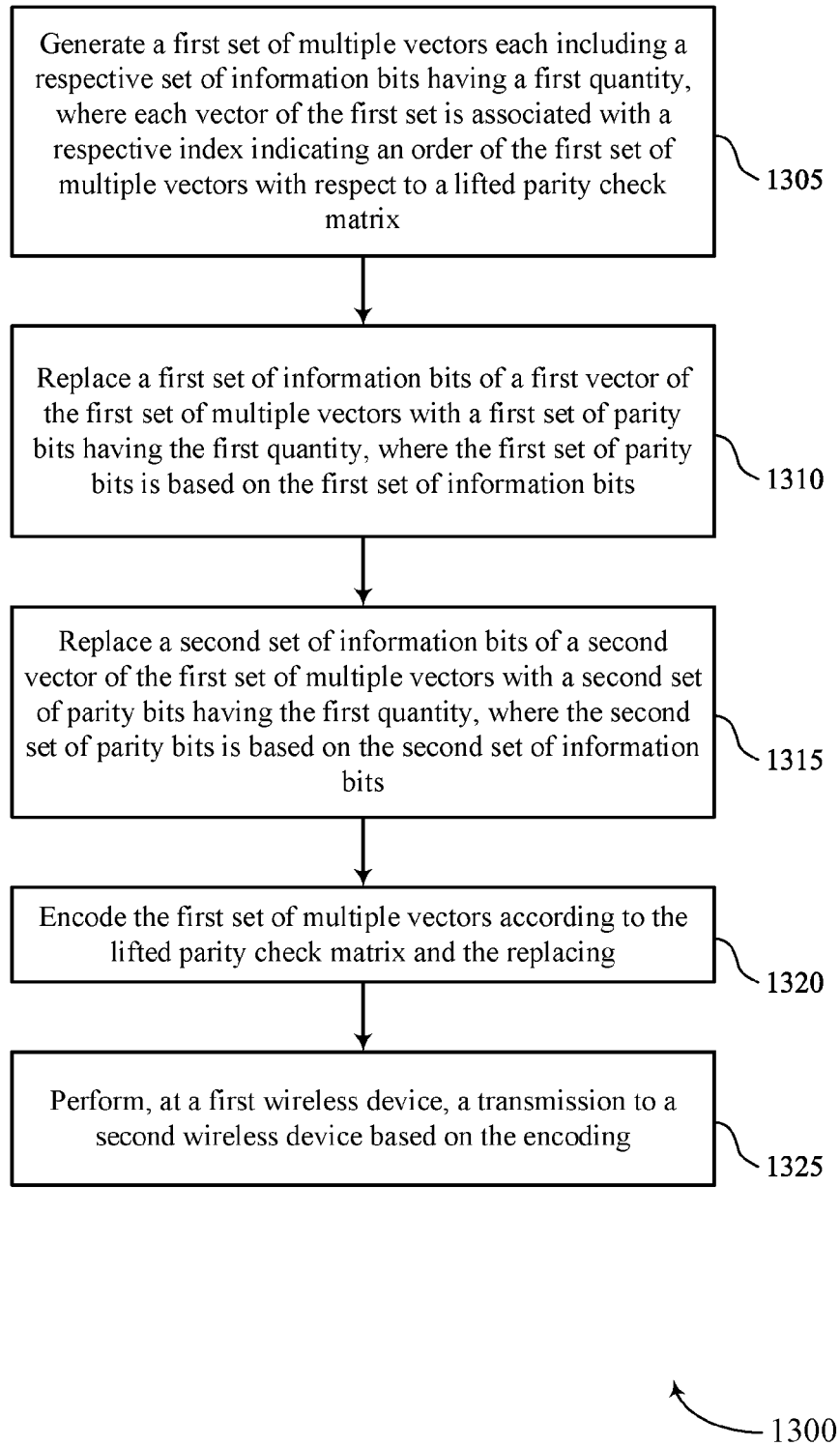

FIG. 13 shows a flowchart illustrating a method 1300 that supports bit replacing for LDPC encoding in accordance with aspects of the present disclosure. The operations of the method 1300 may be implemented by a UE or a base station or its components as described herein. For example, the operations of the method 1300 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1305, the method may include generating a first set of multiple vectors each including a respective set of information bits having a first quantity, where each vector of the first set is associated with a respective index indicating an order of the first set of multiple vectors with respect to a lifted parity check matrix. The operations of 1305 may be performed in accordance with examples as disclosed herein. In some examples, aspects of the operations of 1305 may be performed by a bit generation component 925 as described with reference to FIG. 9.

At 1310, the method may include replacing a first set of information bits of a first vector of the first set of multiple vectors with a first set of parity bits having the first quantity, where the first set of parity bits is based on the first set of information bits. The operations of 1310 may be performed in accordance with examples as disclosed herein. In some examples, aspects of the operations of 1310 may be performed by a preprocessing component 930 as described with reference to FIG. 9.

At 1315, the method may include replacing a second set of information bits of a second vector of the first set of multiple vectors with a second set of parity bits having the first quantity, where the second set of parity bits is based on the second set of information bits. The operations of 1315 may be performed in accordance with examples as disclosed herein. In some examples, aspects of the operations of 1315 may be performed by a preprocessing component 930 as described with reference to FIG. 9.

At 1320, the method may include encoding the first set of multiple vectors according to the lifted parity check matrix and the replacing. The operations of 1320 may be performed in accordance with examples as disclosed herein. In some examples, aspects of the operations of 1320 may be performed by an encoding component 935 as described with reference to FIG. 9.

At 1325, the method may include performing, at a first wireless device, a transmission to a second wireless device based on the encoding. The operations of 1325 may be performed in accordance with examples as disclosed herein. In some examples, aspects of the operations of 1325 may be performed by a transmission component 940 as described with reference to FIG. 9.

Figure 14:
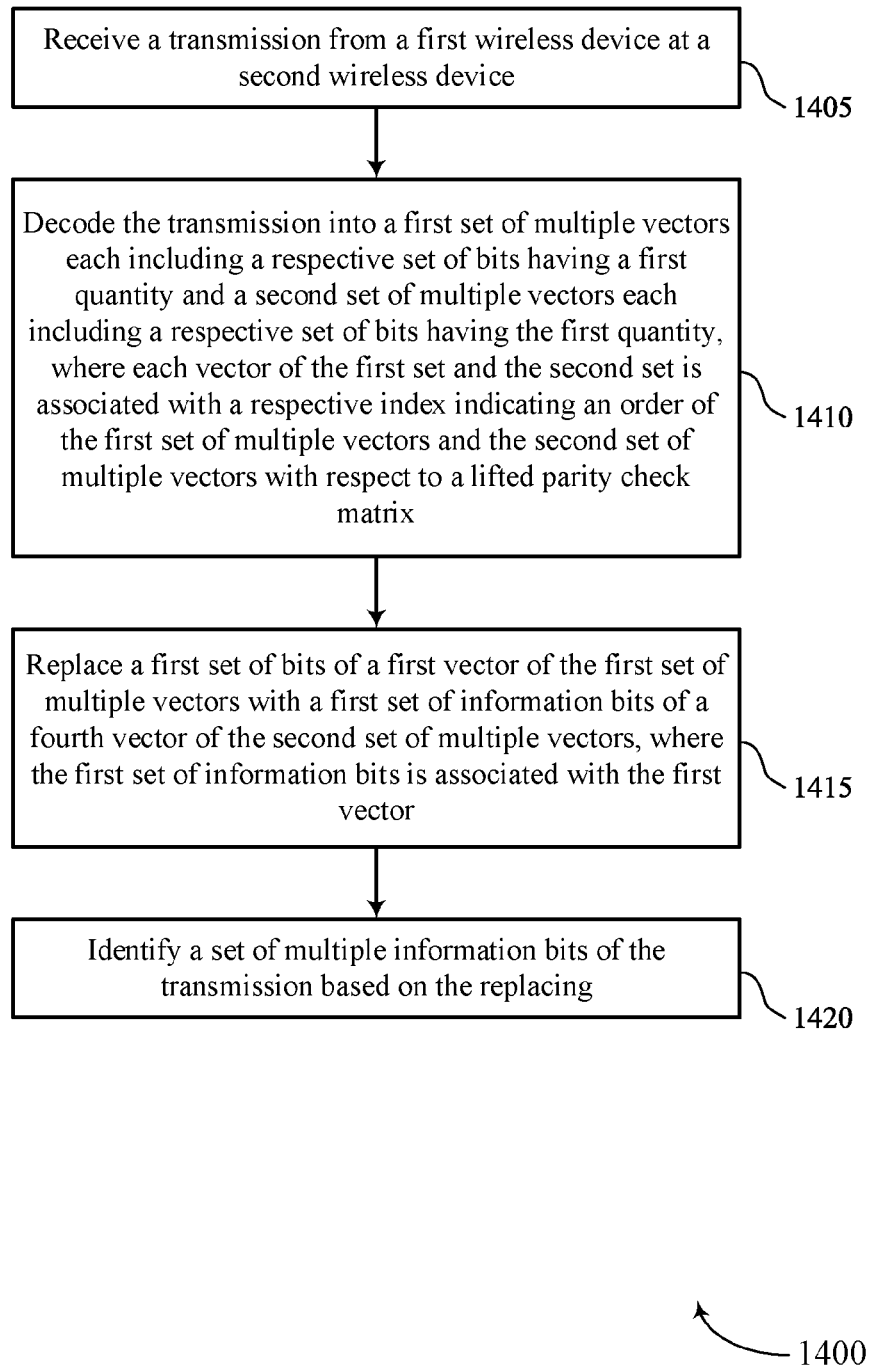

FIG. 14 shows a flowchart illustrating a method 1400 that supports bit replacing for LDPC encoding in accordance with aspects of the present disclosure. The operations of the method 1400 may be implemented by a UE or a base station or its components as described herein. For example, the operations of the method 1400 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1405, the method may include receiving a transmission from a first wireless device at a second wireless device. The operations of 1405 may be performed in accordance with examples as disclosed herein. In some examples, aspects of the operations of 1405 may be performed by a reception component 945 as described with reference to FIG. 9.

At 1410, the method may include decoding the transmission into a first set of multiple vectors each including a respective set of bits having a first quantity and a second set of multiple vectors each including a respective set of bits having the first quantity, where each vector of the first set and the second set is associated with a respective index indicating an order of the first set of multiple vectors and the second set of multiple vectors with respect to a lifted parity check matrix. The operations of 1410 may be performed in accordance with examples as disclosed herein. In some examples, aspects of the operations of 1410 may be performed by a decoding component 950 as described with reference to FIG. 9.

At 1415, the method may include replacing a first set of bits of a first vector of the first set of multiple vectors with a first set of information bits of a fourth vector of the second set of multiple vectors, where the first set of information bits is associated with the first vector. The operations of 1415 may be performed in accordance with examples as disclosed herein. In some examples, aspects of the operations of 1415 may be performed by a postprocessing component 955 as described with reference to FIG. 9.

At 1420, the method may include identifying a set of multiple information bits of the transmission based on the replacing. The operations of 1420 may be performed in accordance with examples as disclosed herein. In some examples, aspects of the operations of 1420 may be performed by a bit identification component 960 as described with reference to FIG. 9.

Figure 15:
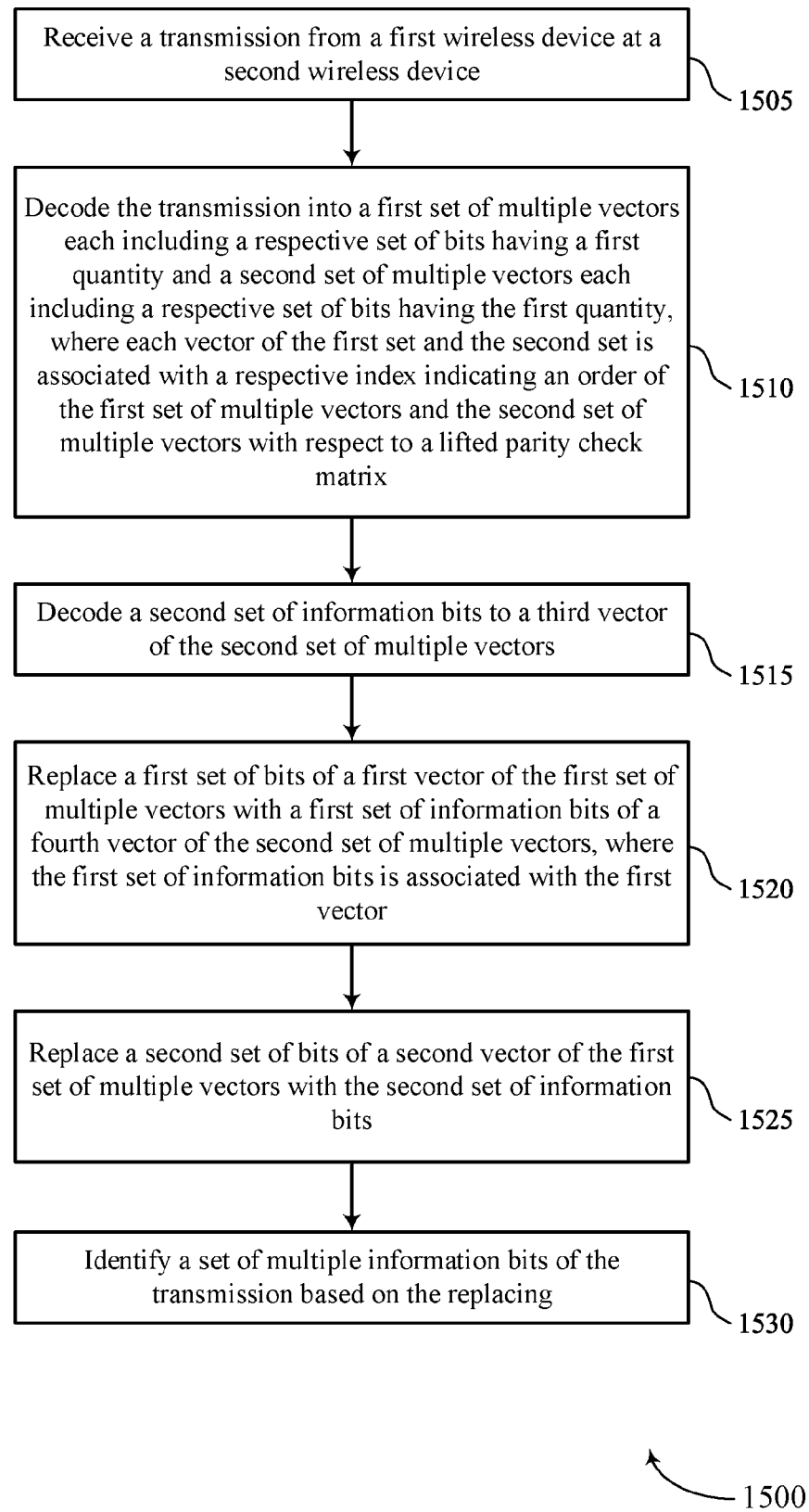

FIG. 15 shows a flowchart illustrating a method 1500 that supports bit replacing for LDPC encoding in accordance with aspects of the present disclosure. The operations of the method 1500 may be implemented by a UE or a base station or its components as described herein. For example, the operations of the method 1500 may be performed by a UE 115 or a base station 105 as described with reference to FIGS. 1 through 11. In some examples, a UE or a base station may execute a set of instructions to control the functional elements of the UE or the base station to perform the described functions. Additionally or alternatively, the UE or the base station may perform aspects of the described functions using special-purpose hardware.

At 1505, the method may include receiving a transmission from a first wireless device at a second wireless device. The operations of 1505 may be performed in accordance with examples as disclosed herein. In some examples, aspects of the operations of 1505 may be performed by a reception component 945 as described with reference to FIG. 9.

At 1510, the method may include decoding the transmission into a first set of multiple vectors each including a respective set of bits having a first quantity and a second set of multiple vectors each including a respective set of bits having the first quantity, where each vector of the first set and the second set is associated with a respective index indicating an order of the first set of multiple vectors and the second set of multiple vectors with respect to a lifted parity check matrix. The operations of 1510 may be performed in accordance with examples as disclosed herein. In some examples, aspects of the operations of 1510 may be performed by a decoding component 950 as described with reference to FIG. 9.

At 1515, the method may include decoding a second set of information bits to a third vector of the second set of multiple vectors. The operations of 1515 may be performed in accordance with examples as disclosed herein. In some examples, aspects of the operations of 1515 may be performed by a decoding component 950 as described with reference to FIG. 9.

At 1520, the method may include replacing a first set of bits of a first vector of the first set of multiple vectors with a first set of information bits of a fourth vector of the second set of multiple vectors, where the first set of information bits is associated with the first vector. The operations of 1520 may be performed in accordance with examples as disclosed herein. In some examples, aspects of the operations of 1520 may be performed by a postprocessing component 955 as described with reference to FIG. 9.

At 1525, the method may include replacing a second set of bits of a second vector of the first set of multiple vectors with the second set of information bits. The operations of 1525 may be performed in accordance with examples as disclosed herein. In some examples, aspects of the operations of 1525 may be performed by a postprocessing component 955 as described with reference to FIG. 9.

At 1530, the method may include identifying a set of multiple information bits of the transmission based on the replacing. The operations of 1530 may be performed in accordance with examples as disclosed herein. In some examples, aspects of the operations of 1530 may be performed by a bit identification component 960 as described with reference to FIG. 9.

The following provides an overview of aspects of the present disclosure:

Aspect 1: A method for wireless communication, comprising: generating a first plurality of vectors each comprising a respective set of information bits having a first quantity, wherein each vector of the first plurality is associated with a respective index indicating an order of the first plurality of vectors with respect to a lifted parity check matrix; replacing a first set of information bits of a first vector of the first plurality of vectors with a first set of parity bits having the first quantity, wherein the first set of parity bits is based at least in part on the first set of information bits; encoding the first plurality of vectors according to the lifted parity check matrix and the replacing; and performing, at a first wireless device, a transmission to a second wireless device based at least in part on the encoding.

Aspect 2: The method of aspect 1, further comprising: replacing a second set of information bits of a second vector of the first plurality of vectors with a second set of parity bits having the first quantity, wherein the second set of parity bits is based at least in part on the second set of information bits.

Aspect 3: The method of aspect 2, further comprising: determining the second set of parity bits based at least in part on the second set of information bits and the first set of parity bits, wherein replacing the second set of information bits is based at least in part on determining the second set of parity bits.

Aspect 4: The method of any of aspects 2 through 3, further comprising: determining the second set of parity bits based at least in part on the second set of information bits, the first set of parity bits, and a group of one or more third sets of information bits each corresponding to a respective vector of the first plurality of vectors, wherein replacing the second set of information bits is based at least in part on determining the second set of parity bits.

Aspect 5: The method of any of aspects 2 through 4, wherein encoding the first plurality of vectors comprises: generating a second plurality of vectors each comprising a respective set of bits having the first quantity, the second plurality of vectors including a third vector that comprises the second set of information bits based at least in part on replacing the second set of information bits of the second vector.

Aspect 6: The method of aspect 5, wherein the transmission comprises the second set of information bits based at least in part on generating the second plurality of vectors.

Aspect 7: The method of any of aspects 5 through 6, further comprising: puncturing the second vector after generating the second plurality of vectors.

Aspect 8: The method of any of aspects 1 through 7, further comprising: determining the first set of parity bits based at least in part on the first set of information bits and a group of one or more second sets of information bits each corresponding to a respective vector of the first plurality of vectors, wherein replacing the first set of information bits is based at least in part on determining the first set of parity bits.

Aspect 9: The method of any of aspects 1 through 8, wherein encoding the first plurality of vectors comprises: generating a second plurality of vectors each comprising a respective set of bits having the first quantity, the second plurality of vectors including a fourth vector that comprises the first set of information bits based at least in part on replacing the first set of information bits of the first vector.

Aspect 10: The method of aspect 9, further comprising: puncturing the first vector after generating the second plurality of vectors.

Aspect 11: The method of any of aspects 1 through 10, wherein encoding the first plurality of vectors comprises: performing a low density parity check encoding process on the first plurality of vectors.

Aspect 12: The method of any of aspects 1 through 11, wherein the transmission comprises the first set of information bits based at least in part on the encoding.

Aspect 13: The method of any of aspects 1 through 12, wherein generating the first plurality of vectors comprises: performing an amplitude shaping process on the first plurality of vectors.

Aspect 14: The method of any of aspects 1 through 13, wherein the lifted parity check matrix comprises: a set of first columns, each first column associated with a respective index corresponding to a vector of the first plurality of vectors; a set of second columns, each second column associated with a respective index corresponding to a vector of a second plurality of vectors each comprising a respective set of parity bits having the first quantity; and a set of rows, each row corresponding to a parity check equation for generating a respective vector of the second plurality of vectors.

Aspect 15: A method for wireless communication, comprising: receiving a transmission from a first wireless device at a second wireless device; decoding the transmission into a first plurality of vectors each comprising a respective set of bits having a first quantity and a second plurality of vectors each comprising a respective set of bits having the first quantity, wherein each vector of the first plurality and the second plurality is associated with a respective index indicating an order of the first plurality of vectors and the second plurality of vectors with respect to a lifted parity check matrix; replacing a first set of bits of a first vector of the first plurality of vectors with a first set of information bits of a fourth vector of the second plurality of vectors, wherein the first set of information bits is associated with the first vector; and identifying a plurality of information bits of the transmission based at least in part on the replacing.

Aspect 16: The method of aspect 15, wherein decoding the transmission comprises: decoding the first set of information bits to the fourth vector; and setting a log-likelihood ratio of the first vector to a value of zero, wherein the first set of bits of the first vector is determined based at least in part on setting the log-likelihood ratio of the first vector to a value of zero.

Aspect 17: The method of any of aspects 15 through 16, wherein the fourth vector is associated with a first parity bit column of the lifted parity check matrix.

Aspect 18: The method of any of aspects 15 through 17, wherein decoding the transmission comprises: decoding a second set of information bits to a third vector of the second plurality of vectors.

Aspect 19: The method of aspect 18, wherein the third vector is associated with a second parity bit column of the lifted parity check matrix.

Aspect 20: The method of any of aspects 18 through 19, further comprising: replacing a second set of bits of a second vector of the first plurality of vectors with the second set of information bits.

Aspect 21: The method of aspect 20, wherein decoding the transmission comprises: setting a log-likelihood ratio of the second vector to a value of zero, wherein the second set of bits of the second vector is determined based at least in part on setting the log-likelihood ratio of the second vector to a value of zero.

Aspect 22: The method of any of aspects 15 through 21, wherein decoding the transmission comprises: performing a low density parity check decoding process on the transmission.

Aspect 23: The method of any of aspects 15 through 22, wherein the lifted parity check matrix comprises: a set of first columns, each first column associated with a respective index corresponding to a vector of the first plurality of vectors; a set of second columns, each second column associated with a respective index corresponding to a vector of the second plurality of vectors; and a set of rows, each row corresponding to a parity check equation for generating a respective vector of the second plurality of vectors.

Aspect 24: An apparatus for wireless communication, comprising a processor; memory coupled with the processor; and instructions stored in the memory and executable by the processor to cause the apparatus to perform a method of any of aspects 1 through 14.

Aspect 25: An apparatus for wireless communication, comprising at least one means for performing a method of any of aspects 1 through 14.

Aspect 26: A non-transitory computer-readable medium storing code for wireless communication, the code comprising instructions executable by a processor to perform a method of any of aspects 1 through 14.

Aspect 27: An apparatus for wireless communication, comprising a processor; memory coupled with the processor; and instructions stored in the memory and executable by the processor to cause the apparatus to perform a method of any of aspects 15 through 23.

Aspect 28: An apparatus for wireless communication, comprising at least one means for performing a method of any of aspects 15 through 23.

Aspect 29: A non-transitory computer-readable medium storing code for wireless communication, the code comprising instructions executable by a processor to perform a method of any of aspects 15 through 23.

It should be noted that the methods described herein describe possible implementations, and that the operations and the steps may be rearranged or otherwise modified and that other implementations are possible. Further, aspects from two or more of the methods may be combined.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special-purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method for wireless communication, comprising:
generating a first plurality of vectors each comprising a respective set of information bits having a first quantity, wherein each vector of the first plurality is associated with a respective index indicating an order of the first plurality of vectors with respect to a lifted parity check matrix;
replacing a first set of information bits of a first vector of the first plurality of vectors with a first set of parity bits having the first quantity, wherein the first set of parity bits is based at least in part on the first set of information bits;
encoding the first plurality of vectors according to the lifted parity check matrix and the replacing; and
performing, at a first wireless device, a transmission to a second wireless device based at least in part on the encoding.

2. The method of claim 1, further comprising:
replacing a second set of information bits of a second vector of the first plurality of vectors with a second set of parity bits having the first quantity, wherein the second set of parity bits is based at least in part on the second set of information bits.

3. The method of claim 2, further comprising:
determining the second set of parity bits based at least in part on the second set of information bits and the first set of parity bits, wherein replacing the second set of information bits is based at least in part on determining the second set of parity bits.

4. The method of claim 2, further comprising:
determining the second set of parity bits based at least in part on the second set of information bits, the first set of parity bits, and a group of one or more third sets of information bits each corresponding to a respective vector of the first plurality of vectors, wherein replacing the second set of information bits is based at least in part on determining the second set of parity bits.

5. The method of claim 2, wherein encoding the first plurality of vectors comprises:
generating a second plurality of vectors each comprising a respective set of bits having the first quantity, the second plurality of vectors including a third vector that comprises the second set of information bits based at least in part on replacing the second set of information bits of the second vector.

6. The method of claim 5, wherein the transmission comprises the second set of information bits based at least in part on generating the second plurality of vectors.

7. The method of claim 5, further comprising:
puncturing the second vector after generating the second plurality of vectors.

8. The method of claim 1, further comprising:
determining the first set of parity bits based at least in part on the first set of information bits and a group of one or more second sets of information bits each corresponding to a respective vector of the first plurality of vectors, wherein replacing the first set of information bits is based at least in part on determining the first set of parity bits.

9. The method of claim 1, wherein encoding the first plurality of vectors comprises:
generating a second plurality of vectors each comprising a respective set of bits having the first quantity, the second plurality of vectors including a fourth vector that comprises the first set of information bits based at least in part on replacing the first set of information bits of the first vector.

10. The method of claim 9, further comprising:
puncturing the first vector after generating the second plurality of vectors.

11. The method of claim 1, wherein encoding the first plurality of vectors comprises:
performing a low density parity check encoding process on the first plurality of vectors.

12. The method of claim 1, wherein the transmission comprises the first set of information bits based at least in part on the encoding.

13. The method of claim 1, wherein generating the first plurality of vectors comprises:
performing an amplitude shaping process on the first plurality of vectors.

14. The method of claim 1, wherein the lifted parity check matrix comprises:
a set of first columns, each first column associated with a respective index corresponding to a vector of the first plurality of vectors;
a set of second columns, each second column associated with a respective index corresponding to a vector of a second plurality of vectors each comprising a respective set of parity bits having the first quantity; and
a set of rows, each row corresponding to a parity check equation for generating a respective vector of the second plurality of vectors.

15. A method for wireless communication, comprising:
receiving a transmission from a first wireless device at a second wireless device;
decoding the transmission into a first plurality of vectors each comprising a respective set of bits having a first quantity and a second plurality of vectors each comprising a respective set of bits having the first quantity, wherein each vector of the first plurality and the second plurality is associated with a respective index indicating an order of the first plurality of vectors and the second plurality of vectors with respect to a lifted parity check matrix;
replacing a first set of bits of a first vector of the first plurality of vectors with a first set of information bits of a fourth vector of the second plurality of vectors, wherein the first set of information bits is associated with the first vector; and
identifying a plurality of information bits of the transmission based at least in part on the replacing.

16. The method of claim 15, wherein decoding the transmission comprises:
decoding the first set of information bits to the fourth vector; and
setting a log-likelihood ratio of the first vector to a value of zero, wherein the first set of bits of the first vector is determined based at least in part on setting the log-likelihood ratio of the first vector to a value of zero.

17. The method of claim 15, wherein the fourth vector is associated with a first parity bit column of the lifted parity check matrix.

18. The method of claim 15, wherein decoding the transmission comprises:
decoding a second set of information bits to a third vector of the second plurality of vectors.

19. The method of claim 18, wherein the third vector is associated with a second parity bit column of the lifted parity check matrix.

20. The method of claim 18, further comprising:
replacing a second set of bits of a second vector of the first plurality of vectors with the second set of information bits.

21. The method of claim 20, wherein decoding the transmission comprises:
setting a log-likelihood ratio of the second vector to a value of zero, wherein the second set of bits of the second vector is determined based at least in part on setting the log-likelihood ratio of the second vector to a value of zero.

22. The method of claim 15, wherein decoding the transmission comprises:
performing a low density parity check decoding process on the transmission.

23. The method of claim 15, wherein the lifted parity check matrix comprises:
a set of first columns, each first column associated with a respective index corresponding to a vector of the first plurality of vectors;
a set of second columns, each second column associated with a respective index corresponding to a vector of the second plurality of vectors; and
a set of rows, each row corresponding to a parity check equation for generating a respective vector of the second plurality of vectors.

24. An apparatus for wireless communication, comprising:
a processor;
memory coupled with the processor; and
instructions stored in the memory and executable by the processor to cause the apparatus to:
generate a first plurality of vectors each comprising a respective set of information bits having a first quantity, wherein each vector of the first plurality is associated with a respective index indicating an order of the first plurality of vectors with respect to a lifted parity check matrix;
replace a first set of information bits of a first vector of the first plurality of vectors with a first set of parity bits having the first quantity, wherein the first set of parity bits is based at least in part on the first set of information bits;
encode the first plurality of vectors according to the lifted parity check matrix and the replacing; and
perform, at a first wireless device, a transmission to a second wireless device based at least in part on the encoding.

25. The apparatus of claim 24, wherein the instructions are further executable by the processor to cause the apparatus to:
replace a second set of information bits of a second vector of the first plurality of vectors with a second set of parity bits having the first quantity, wherein the second set of parity bits is based at least in part on the second set of information bits.

26. The apparatus of claim 25, wherein the instructions to encode the first plurality of vectors are executable by the processor to cause the apparatus to:

generate a second plurality of vectors each comprising a respective set of bits having the first quantity, the second plurality of vectors including a third vector that comprises the second set of information bits based at least in part on replacing the second set of information bits of the second vector.

27. The apparatus of claim 24, wherein the instructions to encode the first plurality of vectors are executable by the processor to cause the apparatus to:

generate a second plurality of vectors each comprising a respective set of bits having the first quantity, the second plurality of vectors including a fourth vector that comprises the first set of information bits based at least in part on replacing the first set of information bits of the first vector.

28. An apparatus for wireless communication, comprising:

a processor;

memory coupled with the processor; and instructions stored in the memory and executable by the processor to cause the apparatus to:

receive a transmission from a first wireless device at a second wireless device;

decode the transmission into a first plurality of vectors each comprising a respective set of bits having a first quantity and a second plurality of vectors each comprising a respective set of bits having the first quantity, wherein each vector of the first plurality and the second plurality is associated with a respective index indicating an order of the first plurality of vectors and the second plurality of vectors with respect to a lifted parity check matrix;

replace a first set of bits of a first vector of the first plurality of vectors with a first set of information bits of a fourth vector of the second plurality of vectors, wherein the first set of information bits associated with the first vector; and identify a plurality of information bits of the transmission based at least in part on the replacing.

29. The apparatus of claim 28, wherein the instructions to decode the transmission are executable by the processor to cause the apparatus to:

decode a second set of information bits to a third vector of the second plurality of vectors.

30. The apparatus of claim 29, wherein the instructions are further executable by the processor to cause the apparatus to:

replace a second set of bits of a second vector of the first plurality of vectors with the second set of information bits.

* * * * *